(12) United States Patent
Mishra et al.

(10) Patent No.: US 11,636,447 B1
(45) Date of Patent: Apr. 25, 2023

(54) SYSTEMS AND METHODS TO DESIGN AND SERVICE AERIAL VEHICLES INCORPORATING REPLACEABLE COMPONENTS

(71) Applicant: Amazon Technologies, Inc., Seattle, WA (US)

(72) Inventors: Pragyana K. Mishra, Seattle, WA (US); Gur Kimchi, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 530 days.

(21) Appl. No.: 16/804,419

(22) Filed: Feb. 28, 2020

(51) Int. Cl.
| | |
|---|---|
| *G06Q 10/00* | (2012.01) |
| *G06F 30/15* | (2020.01) |
| *B64C 39/02* | (2006.01) |
| *G07C 5/08* | (2006.01) |
| *G07C 5/00* | (2006.01) |
| *G06Q 10/20* | (2023.01) |

(52) U.S. Cl.
CPC .......... *G06Q 10/20* (2013.01); *B64C 39/024* (2013.01); *G06F 30/15* (2020.01); *G07C 5/006* (2013.01); *G07C 5/008* (2013.01); *G07C 5/0808* (2013.01)

(58) Field of Classification Search
None
See application file for complete search history.

(56) References Cited

U.S. PATENT DOCUMENTS

| | | | |
|---|---|---|---|
| 9,783,075 B2 * | 10/2017 | Henry | B64D 45/08 |
| 10,435,143 B1 * | 10/2019 | O'Brien | B64C 39/024 |
| 2017/0283090 A1 * | 10/2017 | Miller | B64C 39/024 |

* cited by examiner

*Primary Examiner* — Abdhesh K Jha
(74) *Attorney, Agent, or Firm* — Athorus, PLLC

(57) ABSTRACT

Systems and methods related to designation, design, and service of replaceable components of aerial vehicles may include designating a component as a replaceable component based on a determined service frequency, designing the replaceable component for incorporation into an aerial vehicle based on the service frequency, and servicing the replaceable component according to the service frequency. In this manner, a replaceable component having a relatively high service frequency may be incorporated into an aerial vehicle at a relatively more accessible location, and a replaceable component having a relatively low service frequency may be incorporated into an aerial vehicle at a relatively less accessible location, thereby facilitating efficient and reliable maintenance of replaceable components. Further, replaceable components may be stacked relative to each other based at least in part on respective service frequencies, and/or replaceable components having similar service frequencies may be combined together in replaceable modules.

19 Claims, 11 Drawing Sheets

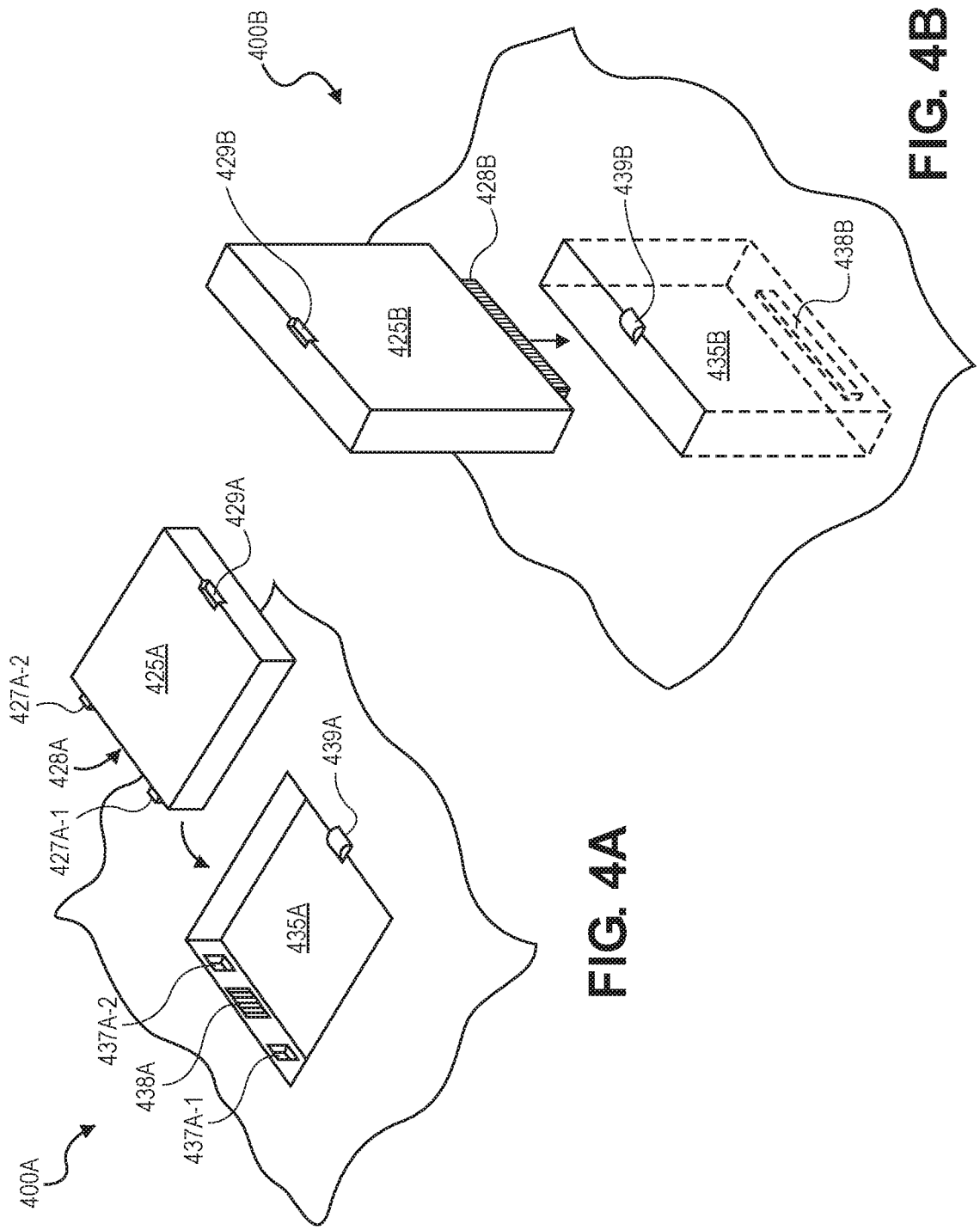

SYSTEMS AND METHODS TO DESIGN AND SERVICE AERIAL VEHICLES INCORPORATING REPLACEABLE COMPONENTS

BACKGROUND

Unmanned vehicles, such as unmanned aerial vehicles ("UAV"), ground, or water based automated vehicles, are continuing to increase in use. For example, UAVs are often used by hobbyists to obtain aerial images of buildings, landscapes, etc. Likewise, unmanned ground based units are often used in materials handling facilities to autonomously transport inventory within the facility. During operations of such unmanned vehicles, various components of such vehicles may degrade or wear out over time. However, the degradation of various components is not well understood, and as a result, service and maintenance of unmanned vehicles may require significant time, cost, and effort. Accordingly, there is a need for systems and methods to design and service unmanned vehicles incorporating replaceable components, such that replaceable components may be efficiently and reliably serviced and maintained over time.

BRIEF DESCRIPTION OF THE DRAWINGS

FIG. 4A illustrates a schematic, perspective view of an example line replaceable unit, in accordance with implementations of the present disclosure.

FIG. 4B illustrates a schematic, perspective view of an example line replaceable unit, in accordance with implementations of the present disclosure.

DETAILED DESCRIPTION

Figure 1:
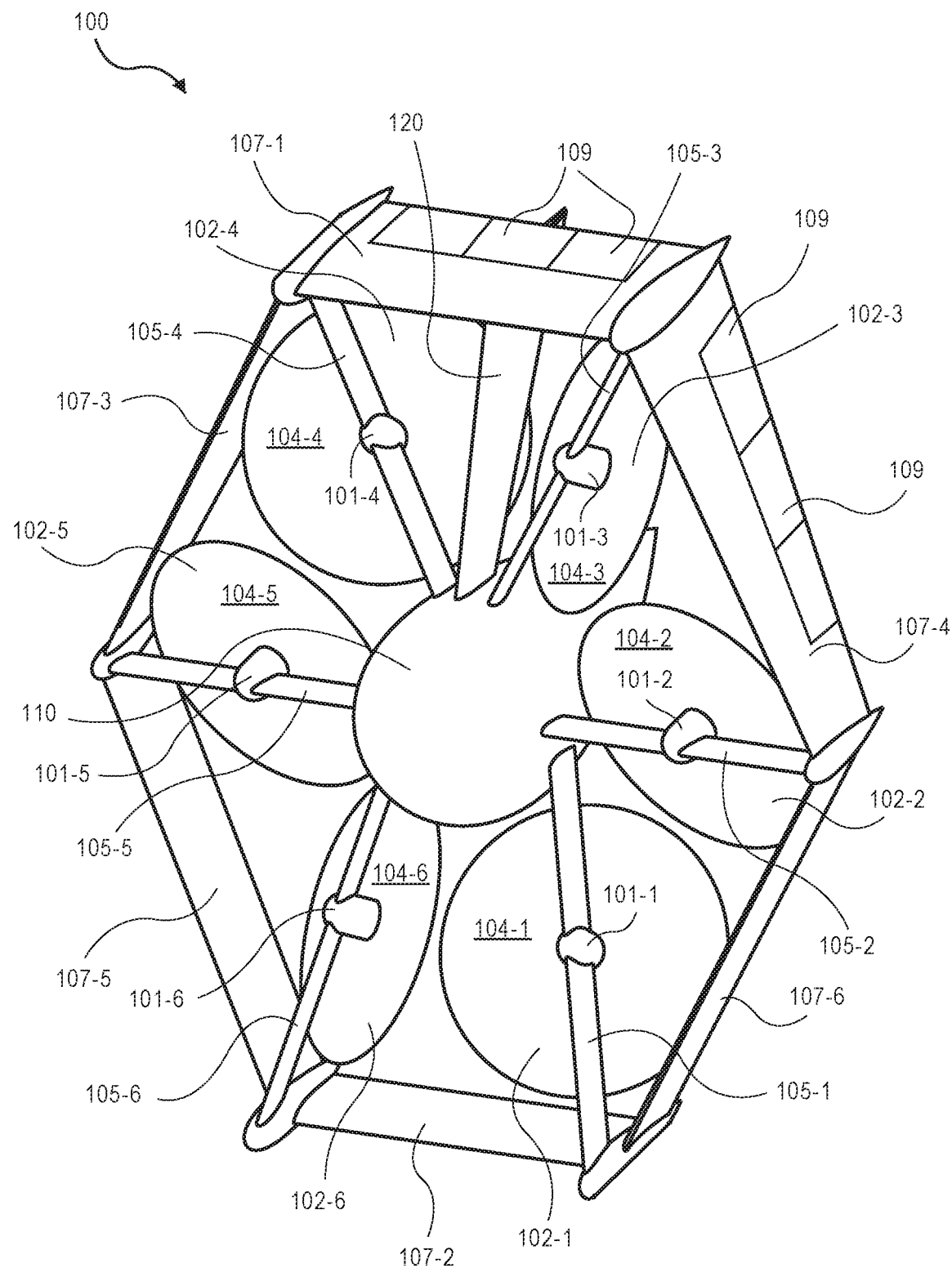
FIG. 1 illustrates a schematic, perspective view of an example aerial vehicle with a substantially hexagonal shaped ring wing and incorporating line replaceable units, in accordance with implementations of the present disclosure.

As is set forth in greater detail below, implementations of the present disclosure are directed to systems and methods to design and service unmanned vehicles, such as unmanned aerial vehicles (UAVs), unmanned ground-based vehicles, unmanned water-based vehicles, or unmanned space-based vehicles, incorporating replaceable components, or line replaceable units (LRUs), that may be efficiently and reliably serviced and maintained over time.

During various operations of UAVs in different environmental conditions, components of the UAVs may experience degradation or wear and tear due to normal operations, weather variations, temperature variations, humidity changes, wind gusts, rain, snow, precipitation, particulates, sunlight, ultraviolet radiation, external forces, impacts or collisions, or various other internal forces, changes, or operations, external forces or changes, or environmental conditions. In order to maintain UAVs in safe, operational states, various components of the UAVs may need to be inspected, serviced, or maintained over time, either as part of normal maintenance schedules or as unscheduled inspection and service responsive to various changes, faults, or errors associated with the components.

In example embodiments, the systems and methods to design and service UAVs incorporating replaceable components, or line replaceable units, may comprise determining the degradation or service profiles of various components of UAVs. For example, data associated with an operational profile of a component, an environmental profile experienced by the component, and/or reliability or durability testing of the component may be processed and analyzed to determine a service frequency associated with the component. In addition, different operational profiles and/or different environmental profiles may result in different service frequencies for the same type of component. The replaceable components may include various types of components, such as propellers, motors, electronic speed controllers, control servos, control rods, control surfaces, ailerons, landing gear, power supplies, sensors, imaging devices, magnetometers, altimeters, pitot tubes, cables, wires, connectors, antennas, compute boards, or other components.

In additional example embodiments, the systems and methods to design and service UAVs incorporating replaceable components, or line replaceable units, may comprise designing a replaceable component to be incorporated into a UAV based at least in part on the service frequency associated with the component. For example, based on an operational profile and/or environmental profile associated with the UAV, a component with a relatively high service frequency may be designed to be positioned at a relatively more accessible location of the UAV, e.g., at an outer portion of a body or other portion of the UAV. Likewise, based on an operational profile and/or environmental profile associated with the UAV, a component with a relatively low service frequency may be designed to be positioned at a relatively less accessible location of the UAV, e.g., at an inner portion of a body or other portion of the UAV. Further, components having different service frequencies may be stacked at respective locations of the UAV, with components having relatively higher service frequencies positioned at outer, more accessible locations of the stack, and components having relatively lower service frequencies positioned at inner, less accessible locations of the stack. Moreover, various components having similar service frequencies may also be designed to form a replaceable module, which may be serviced as a single unit that houses or contains the various components. A replaceable component incorporated into the UAV may also be designed with a particular connection type, for a particular service type, and/or for a particular service agent, as further described herein.

In further example embodiments, the systems and methods to design and service UAVs incorporating replaceable components, or line replaceable units, may comprise servicing a replaceable component incorporated into a UAV based at least in part on the service frequency associated with the component. For example, based on operational data and/or environmental data associated with the UAV, it may be determined to service a replaceable component incorporated into the UAV. In addition, based on the particular location, particular connection type, particular service type, and/or particular service agent associated with the replaceable component, a service station may be selected to service the replaceable component of the UAV, and the UAV may be routed to the service station for service to be performed on the replaceable component. Further, replaceable components that are stacked at respective locations of the UAV may be serviced at the same service station, e.g., a second component stacked under a first component may be serviced after removal and during servicing of the first component. Moreover, components that are positioned at different locations of the UAV may be serviced substantially independently from each other, e.g., at the same service station or at different service stations.

Although the discussion herein describes example embodiments generally in the context of aerial vehicles or UAVs, the systems and methods to design and service vehicles described herein may be similarly applied to other types of vehicles, e.g., ground-based vehicles, water-based vehicles, space-based vehicles, or other types of vehicles, as well as other systems, machines, or equipment incorporating replaceable components, or line replaceable units, having associated service frequencies.

FIG. 1 illustrates a schematic, perspective view of an example aerial vehicle 100 with a substantially hexagonal shaped ring wing and incorporating line replaceable units, in accordance with implementations of the present disclosure.

As shown in FIG. 1, an aerial vehicle 100 may include a ring wing that is substantially hexagonal in shape and that surrounds a plurality of propulsion mechanisms. The aerial vehicle 100 includes six propulsion mechanisms 102-1, 102-2, 102-3, 102-4, 102-5, and 102-6 spaced about the fuselage 110 of the aerial vehicle 100. As discussed above, while the propulsion mechanisms 102 may include motors 101-1, 101-2, 101-3, 101-4, 101-5, and 101-6 and propellers 104-1, 104-2, 104-3, 104-4, 104-5, and 104-6, in other implementations, other forms of propulsion may be utilized as the propulsion mechanisms 102. For example, one or more of the propulsion mechanisms 102 of the aerial vehicle 100 may utilize fans, jets, turbojets, turbo fans, jet engines, and/or the like to maneuver the aerial vehicle. Generally described, a propulsion mechanism 102, as used herein, includes any form of propulsion mechanism that is capable of generating a force sufficient to maneuver the aerial vehicle, alone and/or in combination with other propulsion mechanisms. Furthermore, in selected implementations, propulsion mechanisms (e.g., 102-1, 102-2, 102-3, 102-4, 102-5, and 102-6) may be configured such that their individual orientations may be dynamically modified (e.g., change from vertical flight orientation to horizontal flight orientation, or any position therebetween).

Likewise, while the examples herein describe the propulsion mechanisms being able to generate force in either direction, in some implementations, the propulsion mechanisms may only generate force in a single direction. However, the orientation of the propulsion mechanisms may be adjusted so that the force can be oriented in a positive direction, a negative direction, and/or any other direction.

In this implementation, the aerial vehicle 100 also includes a ring wing 107 having a substantially hexagonal shape that extends around and forms the perimeter of the aerial vehicle 100. In the illustrated example, the ring wing has six sections or segments 107-1, 107-2, 107-3, 107-4, 107-5, and 107-6 that are joined at adjacent ends to form the ring wing 107 around the aerial vehicle 100. Each segment of the ring wing 107 has an airfoil shape to produce lift when the aerial vehicle is oriented as illustrated in FIG. 1 and moving in a direction that is substantially horizontal. As illustrated, the ring wing is positioned at an angle with respect to the fuselage 110 such that the lower segment 107-2 of the ring wing acts as a front wing as it is toward the front of the aerial vehicle when oriented as shown and moving in a horizontal direction. The upper segment 107-1 of the ring wing, which has a longer chord length than the lower segment 107-2 of the ring wing 107, is farther back and thus acts as a rear wing.

The ring wing 107 is secured to the fuselage 110 by motor arms 105. In this example, all six motor arms 105-1, 105-2, 105-3, 105-4, 105-5, and 105-6 are coupled to the fuselage at one end, extend from the fuselage 110 and couple to the ring wing 107 at a second end, thereby securing the ring wing 107 to the fuselage 110. In other implementations, less than all of the motor arms may extend from the fuselage 110 and couple to the ring wing 107. For example, motor arms 105-2 and 105-5 may be coupled to the fuselage 110 at one end and extend outward from the fuselage but not couple to the ring wing 107.

In some implementations, the aerial vehicle may also include one or more stabilizer fins 120 that extend from the fuselage 110 to the ring wing 107. The stabilizer fin 120 may also have an airfoil shape. In the illustrated example, the stabilizer fin 120 extends vertically from the fuselage 110 to the ring wing 107. In other implementations, the stabilizer fin may be at other positions. For example, the stabilizer fin may extend downward from the fuselage between motor arm 105-1 and motor arm 105-6.

In general, one or more stabilizer fins may extend from the fuselage 110, between any two motor arms 105 and couple to an interior of the ring wing 107. For example, stabilizer fin 120 may extend upward between motor arms 105-3 and 105-4, a second stabilizer fin may extend from the fuselage and between motor arms 105-5 and 105-6, and a third stabilizer fin may extend from the fuselage and between motor arms 105-1 and 105-2.

Likewise, while the illustrated example shows the stabilizer fin extending from the fuselage 110 at one end and coupling to the interior of the ring wing 107 at a second end, in other implementations, one or more of the stabilizer fin(s) may extend from the fuselage and not couple to the ring wing or may extend from the ring wing and not couple to the fuselage. In some implementations, one or more stabilizer fins may extend from the exterior of the ring wing 107, one or more stabilizer fins may extend from the interior of the ring wing 107, one or more stabilizer fins may extend from the fuselage 110, and/or one or more stabilizer fins may extend from the fuselage 110 and couple to the interior of the ring wing 107.

The fuselage 110, motor arms 105, stabilizer fin 120, and ring wing 107 of the aerial vehicle 100 may be formed of any one or more suitable materials, such as graphite, carbon fiber, and/or aluminum. Further, various components such as the propulsion mechanisms 102, motors 101, propellers 104, motor arms 105, wing segments 107, control surfaces 109, stabilizer fins 120, portions of the fuselage 110, and/or one or more components coupled to any of the above components and/or positioned within the fuselage 110 may comprise replaceable components, or line replaceable units, as further described herein.

Each of the propulsion mechanisms 102 are coupled to a respective motor arm 105 (or propulsion mechanism arm) such that the propulsion mechanism 102 is substantially contained within the perimeter of the ring wing 107. For example, propulsion mechanism 102-1 is coupled to motor arm 105-1, propulsion mechanism 102-2 is coupled to motor arm 105-2, propulsion mechanism 102-3 is coupled to motor arm 105-3, propulsion mechanism 102-4 is coupled to motor arm 105-4, propulsion mechanism 102-5 is coupled to motor arm 105-5, and propulsion mechanism 102-6 is coupled to motor arm 105-6. In the illustrated example, each propulsion mechanism 102-1, 102-2, 102-3, 102-4, 102-5, and 102-6 is coupled at an approximate mid-point of the respective motor arm 105-1, 105-2, 105-3, 105-4, 105-5, and 105-6 between the fuselage 110 and the ring wing 107. In other embodiments, some propulsion mechanisms 102 may be coupled toward an end of the respective motor arm 105. In other implementations, the propulsion mechanisms may be coupled at other locations along the motor arms. Likewise, in some implementations, some of the propulsion mechanisms may be coupled to a mid-point of the motor arms and some of the propulsion mechanisms may be coupled at other locations along respective motor arms (e.g., closer toward the fuselage 110 or closer toward the ring wing 107).

As illustrated, the propulsion mechanisms 102 may be oriented at different angles with respect to each other. For example, propulsion mechanisms 102-2 and 102-5 are aligned with the fuselage 110 such that the force generated by each of propulsion mechanisms 102-2 and 102-5 is in-line or in the same direction or orientation as the fuselage. In the illustrated example, the aerial vehicle 100 is oriented for horizontal flight such that the fuselage is oriented horizontally in the direction of travel. In such an orientation, the propulsion mechanisms 102-2 and 102-5 provide horizontal forces, also referred to herein as thrusting forces and act as thrusting propulsion mechanisms.

In comparison to propulsion mechanisms 102-2 and 102-5, each of propulsion mechanisms 102-1, 102-3, 102-4, and 102-6 are offset or angled with respect to the orientation of the fuselage 110. When the aerial vehicle 100 is oriented horizontally as shown in FIG. 1 for horizontal flight, the propulsion mechanisms 102-1, 102-3, 102-4, and 102-6 may be used as propulsion mechanisms, providing thrust in a non-horizontal direction to cause the aerial vehicle to pitch, yaw, roll, heave and/or sway. In other implementations, during horizontal flight, the propulsion mechanisms 102-1, 102-3, 102-4, and 102-6 may be disabled such that they do not produce any forces and the aerial vehicle 100 may be propelled aerially in a horizontal direction as a result of the lifting force from the aerodynamic shape of the ring wing 107 and the horizontal thrust produced by the thrusting propulsion mechanisms 102-2 and 102-5.

In some implementations, one or more segments of the ring wing 107 may include ailerons, control surfaces, and/or trim tabs 109 that may be adjusted to control the aerial flight of the aerial vehicle 100. For example, one or more ailerons, control surfaces, and/or trim tabs 109 may be included on the upper segment 107-1 of the ring wing 107 and/or one or more ailerons, control surfaces, and/or trim tabs 109 may be included on the side segments 107-4 and/or 107-3. Further, one or more ailerons, control surfaces, and/or trim tabs 109 may also be included on one or more of the remaining segments 107-2, 107-5, and 107-6. The ailerons, control surfaces, and/or trim tabs 109 may be operable to control the pitch, yaw, and/or roll of the aerial vehicle during horizontal flight when the aerial vehicle 100 is oriented as illustrated in FIG. 1.

The angle of orientation of each of the propulsion mechanisms 102-1, 102-2, 102-3, 102-4, 102-5, and 102-6 may vary for different implementations. Likewise, in some implementations, the offset of the propulsion mechanisms 102-1, 102-2, 102-3, 102-4, 102-5, and 102-6 may each be the same, with some oriented in one direction and some oriented in another direction, may each be oriented different amounts, and/or in different directions.

In the illustrated example of FIG. 1, each propulsion mechanism 102-1, 102-2, 102-3, 102-4, 102-5, and 102-6 may be oriented approximately thirty degrees with respect to the position of each respective motor arm 105-1, 105-2, 105-3, 105-4, 105-5, and 105-6. In addition, the direction of orientation of the propulsion mechanisms is such that pairs of propulsion mechanisms are oriented toward one another. For example, propulsion mechanism 102-1 is oriented approximately thirty degrees toward propulsion mechanism 102-6. Likewise, propulsion mechanism 102-2 is oriented approximately thirty degrees in a second direction about the second motor arm 105-2 and oriented toward propulsion mechanism 102-3. Finally, propulsion mechanism 102-4 is oriented approximately thirty degrees in the first direction about the fourth motor arm 105-4 and toward propulsion 102-5. As illustrated, propulsion mechanisms 102-2 and 102-5, which are on opposing sides of the fuselage 110, are aligned and oriented in a same first direction (in this example, horizontal). Propulsion mechanisms 102-3 and 102-6, which are on opposing sides of the fuselage 110, are aligned and oriented in a same second direction, which is angled compared to the first direction. Propulsion mechanisms 102-1 and 102-4, which are on opposing sides of the fuselage 110, are aligned and oriented in a same third direction, which is angled compared to the first direction and the second direction.

Figure 2A:
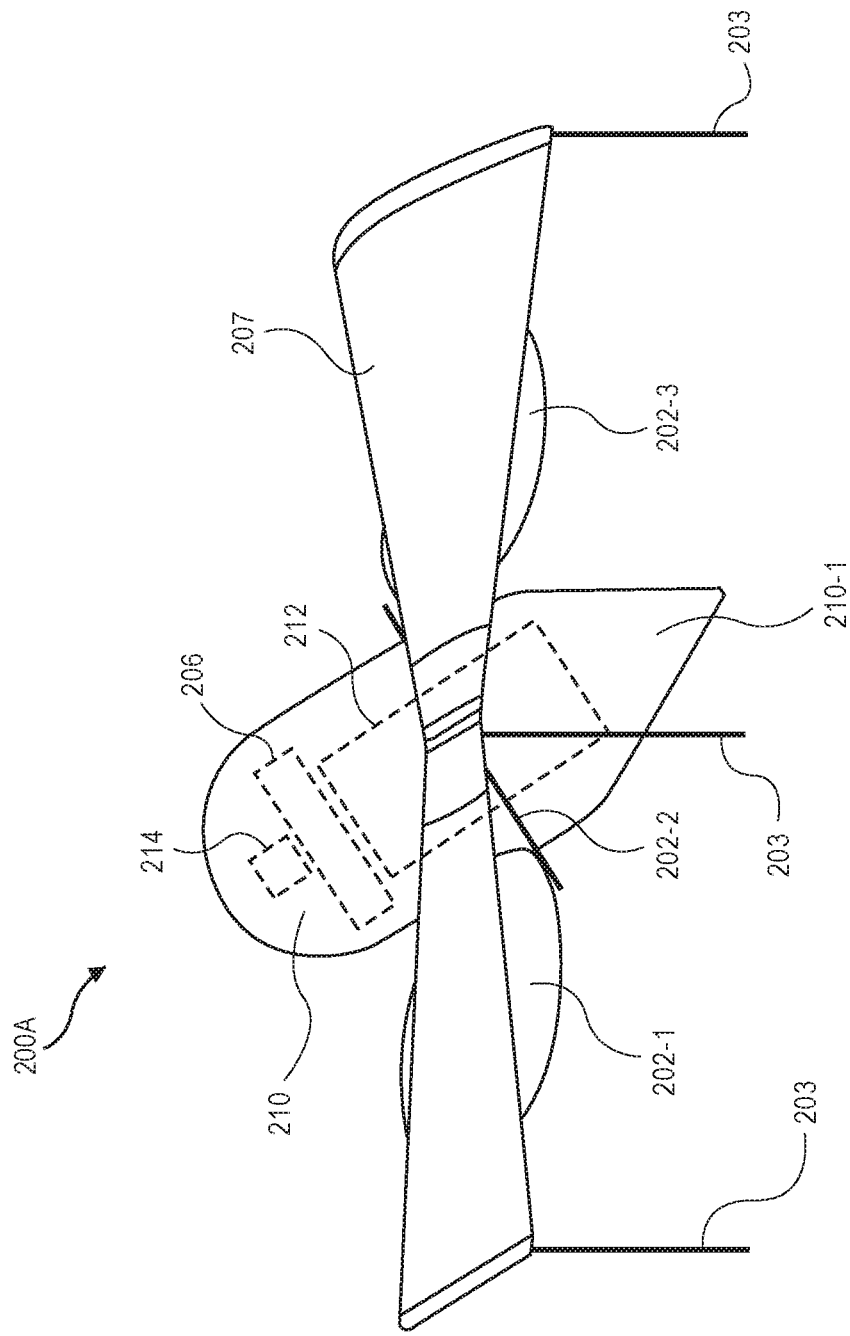
FIG. 2A illustrates a schematic, side view of an example aerial vehicle incorporating line replaceable units, in accordance with implementations of the present disclosure.

FIG. 2A illustrates a schematic, side view of an example aerial vehicle 200A incorporating line replaceable units, in accordance with implementations of the present disclosure.

As shown in FIG. 2A, the aerial vehicle 200A may correspond to the aerial vehicle 100 discussed above with respect to FIG. 1. When oriented as illustrated in FIG. 2A, the aerial vehicle may maneuver in any of the six degrees of freedom (pitch, yaw, roll, heave, surge, and sway), thereby enabling VTOL and high maneuverability.

As illustrated, when the aerial vehicle is oriented for VTOL, the motor arms and the ring wing 207 are aligned approximately horizontally and in the same plane. In this orientation, each of the propulsion mechanisms are offset or angled with respect to the horizontal and/or vertical direction. As such, each propulsion mechanism 202, when generating a force, generates a force that includes both a horizontal component and a vertical component. In the illustrated example, each propulsion mechanism is angled approximately thirty degrees with respect to vertical. Likewise, as discussed above, adjacent propulsion mechanisms are angled in opposing directions to form pairs of propulsion mechanisms. For example, propulsion mechanism 202-2 is oriented toward propulsion mechanism 202-3. As discussed further below, angling adjacent propulsion mechanisms toward one another to form pairs of propulsion mechanisms allows horizontal forces from each propulsion mechanism to cancel out such that the pair of propulsion mechanisms can produce a net vertical force. Likewise, if one of the propulsion mechanisms of a pair of propulsion mechanisms is producing a larger force than the other propulsion mechanism of the pair, a net horizontal force will result from the pair of propulsion mechanisms. Accordingly, when the aerial vehicle 200A is oriented for VTOL with angled propulsion mechanisms, as illustrated in FIG. 2A, the aerial vehicle can move independently in any of the six degrees of freedom. For example, if the aerial vehicle is to surge in the X direction, it can do so by altering the forces produced by the propulsion mechanisms to generate a net horizontal force in the X direction without having to pitch forward to enable a surge in the X direction.

To enable the fuselage to be oriented horizontally with an offset ring wing 207 during horizontal flight, as illustrated in FIG. 1, the fuselage is rotated at an angle when the aerial vehicle 200A is oriented for VTOL, as illustrated in FIG. 2A. In this example the fuselage 210 is angled at approximately thirty degrees from vertical. In other implementations, the amount of rotation from vertical may be greater or less depending on the amount of offset desired for the ring wing 207 when the aerial vehicle 200A is oriented for horizontal flight.

The aerial vehicle may also include one or more landing gears 203 that are extendible to a landing position, as illustrated in FIG. 2A. During flight, the landing gear 203 may be retracted into the interior of the ring wing 207 and/or may be rotated up and remain along the trailing edge of the ring wing. In still other examples, the landing gear may be permanently affixed.

The fuselage 210 may be used to house or store one or more components of the aerial vehicle, such as the aerial vehicle control system 214, a power supply 206, and/or a payload 212 that is transported by the aerial vehicle. The aerial vehicle control system 214 is discussed further below. The power supply 206 may be removably mounted to the aerial vehicle 200A. The power supply 206 for the aerial vehicle may be, for example, in the form of battery power, solar power, gas power, super capacitor, fuel cell, alternative power generation source, or a combination thereof. The power supply 206 may be coupled to and provide power for the aerial vehicle control system 214, the propulsion mechanisms 202, and the payload engagement module 210-1.

In some implementations, one or more of the power modules may be configured such that it can be autonomously removed and/or replaced with another power module. For example, when the aerial vehicle lands at a delivery location, relay location and/or materials handling facility, the aerial vehicle may engage with a charging member at the location that will recharge the power module.

The payload 212 may be any payload that is to be transported by the aerial vehicle. In some implementations, the aerial vehicle may be used to aerially deliver items ordered by customers for aerial delivery and the payload may include one or more customer ordered items. For example, a customer may order an item from an electronic commerce website and the item may be delivered to a customer specified delivery location using the aerial vehicle 200A.

In some implementations, the fuselage 210 may include a payload engagement module 210-1. For example, the payload engagement module 210-1 may be a hinged portion of the fuselage 210 that can rotate between an open position, in which the interior of the fuselage is accessible so that the payload 212 may be added to or removed from the fuselage, and a closed position, as illustrated in FIG. 2A, so that the payload 212 is secured within the interior of the fuselage.

Further, various components of the aerial vehicle 200A such as the propulsion mechanisms 202, motors, propellers, motor arms, wing segments 207, control surfaces, stabilizer fins, landing gear 203, portions of the fuselage 210, and/or one or more components coupled to any of the above components and/or positioned within the fuselage 210, including the power supply 206 and aerial vehicle control system 214, may comprise replaceable components, or line replaceable units, as further described herein.

However, as illustrated in FIG. 2A, the replaceable components of the aerial vehicle 200A may not be designed or incorporated into the aerial vehicle 200A based at least in part on service frequencies associated with the replaceable components. For example, as shown in FIG. 2A, the power supply 206 and aerial vehicle control system 214 may be positioned substantially centered within an inner portion of the fuselage 210, even though the power supply 206 may need to be serviced, e.g., removed and replaced, at a relatively high service frequency, and the aerial vehicle control system 214 may need to be serviced, e.g., updated or calibrated, at a relatively low service frequency. Thus, the location of the power supply 206 within the inner portion of the fuselage 210 may result in inefficient, time-consuming, and costly service and maintenance of the power supply 206, in order to maintain safe and reliable operation of the aerial vehicle 200A.

Figure 2B:
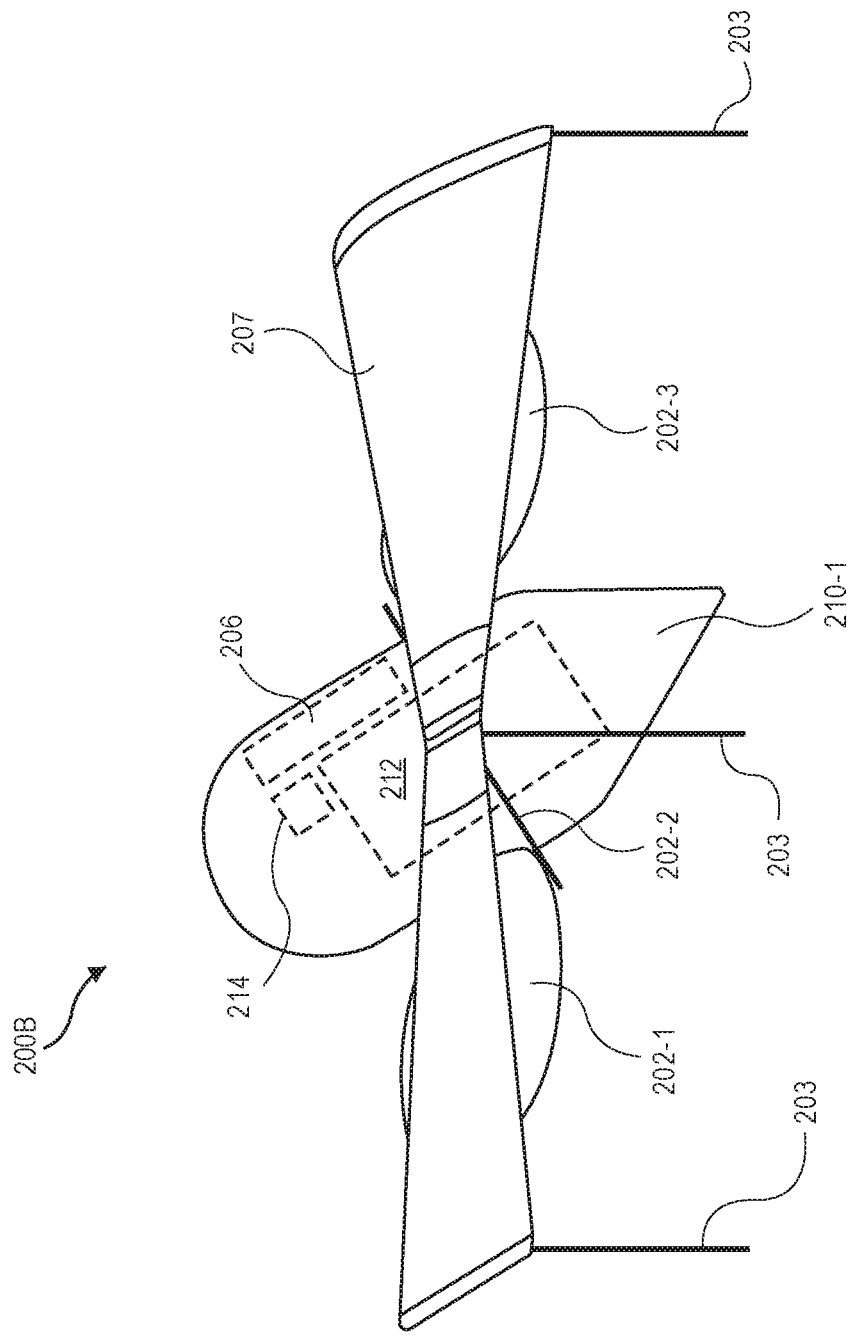
FIG. 2B illustrates a schematic, side view of an example aerial vehicle incorporating line replaceable units, in accordance with implementations of the present disclosure.

FIG. 2B illustrates a schematic, side view of an example aerial vehicle 200B incorporating line replaceable units, in accordance with implementations of the present disclosure.

As shown in FIG. 2B, the aerial vehicle 200B may correspond to the aerial vehicle 100 discussed above with respect to FIG. 1 and the aerial vehicle 200A discussed above with respect to FIG. 2A. When oriented as illustrated in FIG. 2B, the aerial vehicle may maneuver in any of the six degrees of freedom (pitch, yaw, roll, heave, surge, and sway), thereby enabling VTOL and high maneuverability.

Further, various components of the aerial vehicle 200B such as the propulsion mechanisms 202, motors, propellers, motor arms, wing segments 207, control surfaces, stabilizer fins, landing gear 203, portions of the fuselage 210, and/or one or more components coupled to any of the above components and/or positioned within the fuselage 210, including the power supply 206 and aerial vehicle control system 214, may comprise replaceable components, or line replaceable units, as further described herein.

In contrast to the aerial vehicle 200A shown in FIG. 2A, the replaceable components of the aerial vehicle 200B shown in FIG. 2B may be designed or incorporated into the aerial vehicle 200B based at least in part on service frequencies associated with the replaceable components. For example, as shown in FIG. 2B, the power supply 206 and aerial vehicle control system 214 may be positioned at respective locations within the fuselage based at least in part on service frequencies of the power supply 206 and aerial vehicle control system 214. In this example, the power supply 206 may have a relatively higher service frequency than the aerial vehicle control system 214, and as a result, the power supply 206 may be positioned at a location that is closer to an outer portion of the fuselage 210, and the aerial vehicle control system 214 may be positioned at a location that is closer to an inner portion of the fuselage 210. The location of the power supply 206 may be more easily accessible than the location of the aerial vehicle control system 214. Further, the power supply 206 and aerial vehicle control system 214 may be stacked relative to each other based on their respective service frequencies.

In this manner, the power supply 206 may be serviced, e.g., removed and replaced, at a relatively high service frequency, and the location of the power supply 206 may accordingly be more easily accessible for such service or maintenance. Moreover, the aerial vehicle control system 214 may be serviced, e.g., updated or calibrated, at a relatively low service frequency, and because the aerial vehicle control system 214 is stacked under the power supply 206, the aerial vehicle control system 214 may be serviced at the relatively low service frequency during one of the more frequent times of service or maintenance associated with the power supply 206.

Accordingly, the aerial vehicle 200B as shown in FIG. 2B may be designed to incorporate one or more replaceable components, or line replaceable units, at respective locations of the aerial vehicle based at least in part on respective service frequencies. As a result, service or maintenance of such replaceable components may be more efficiently and reliably performed in order to maintain safe operations of the aerial vehicles.

Although FIGS. 1, 2A, and 2B illustrate a particular type or configuration of aerial vehicle having one or more replaceable components, or line replaceable units, various other types or configurations of aerial vehicles, e.g., quadcopters, octocopters, aerial vehicles without wings, aerial vehicles that are similar to conventional aircraft designs, etc., may also include one or more replaceable components, as described herein. Further, although replaceable components are generally shown and described herein in relation to a body or fuselage of an aerial vehicle, the one or more replaceable components may be associated with various other portions of an aerial vehicle, such as a body or fuselage, a frame, a propulsion mechanism, a motor arm, a support arm, a stabilizer fin, a wing, a landing gear, or any other portion of an aerial vehicle.

Figure 3:
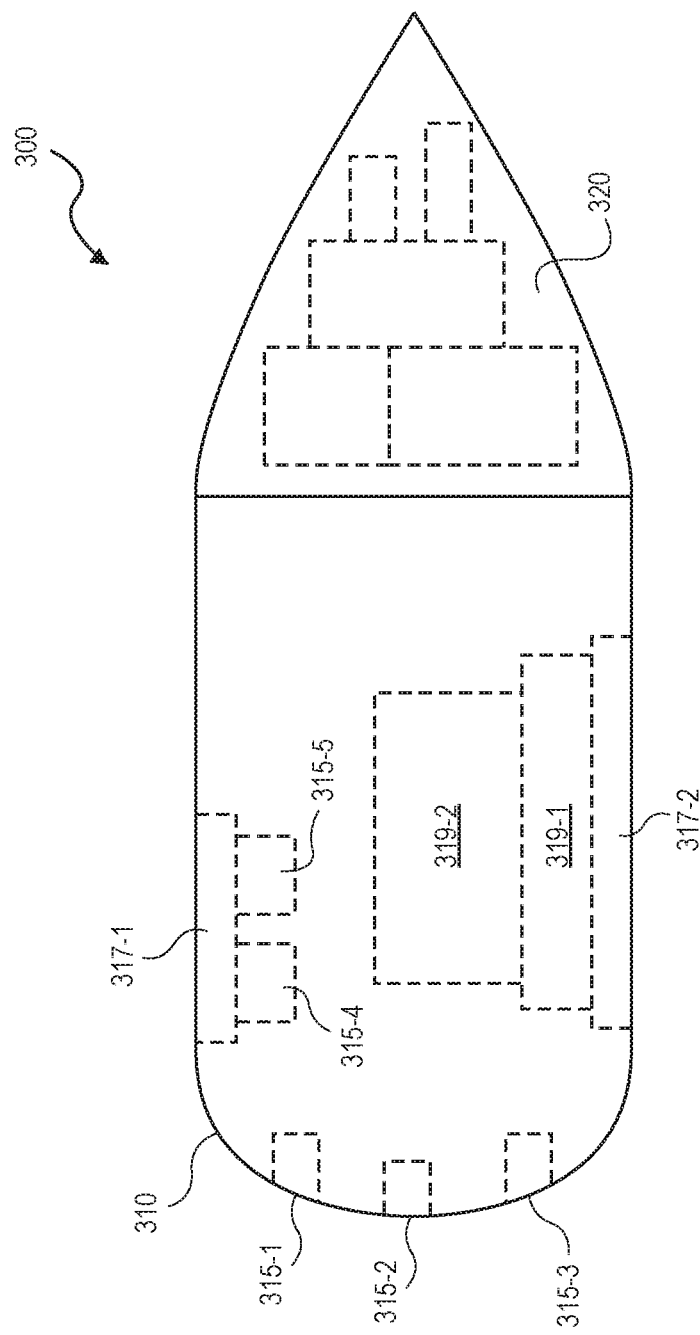
FIG. 3 illustrates a schematic, side view of an example fuselage of an aerial vehicle incorporating line replaceable units, in accordance with implementations of the present disclosure.

FIG. 3 illustrates a schematic, side view of an example fuselage 310 of an aerial vehicle 300 incorporating line replaceable units, in accordance with implementations of the present disclosure.

In example embodiments, in order to designate and design replaceable components, or line replaceable units, to incorporate into an aerial vehicle, degradation or service profiles associated with various components may be determined. The degradation or service profiles of various components may be determined based on operational data of components and aerial vehicles, environmental data of components and aerial vehicles, and reliability and durability testing data of components and aerial vehicles.

The operational data of components and aerial vehicles may comprise flight data or mission data of aerial vehicles, rotational speed, current, voltage, power, temperature, faults, errors, or other data of propellers, motors, or control servos, current, voltage, power, temperature, faults, errors, or other data of power supplies, sensors, imaging devices, magnetometers, altimeters, cables, wires, connections, antennas, electronic speed controllers, or compute boards, movement, force, load, temperature, faults, errors, or other data of control rods, control surfaces, ailerons, pitot tubes, or landing gear, and/or any other data associated with operations of various components of aerial vehicles.

The environmental data of components and aerial vehicles may comprise weather variations, temperature variations, humidity changes, wind gusts, rain, snow, precipitation, particulates, sunlight, ultraviolet radiation, external forces, impacts or collisions, and/or any other environmental conditions experienced by various components of aerial vehicles.

The reliability and durability testing data of components and aerial vehicles may comprise mechanical testing, force or load testing, vibration testing, impact testing, electrical testing, current, voltage, or power testing, temperature testing, life cycle testing, and/or any other testing data associated with various components of aerial vehicles.

Figure 9:
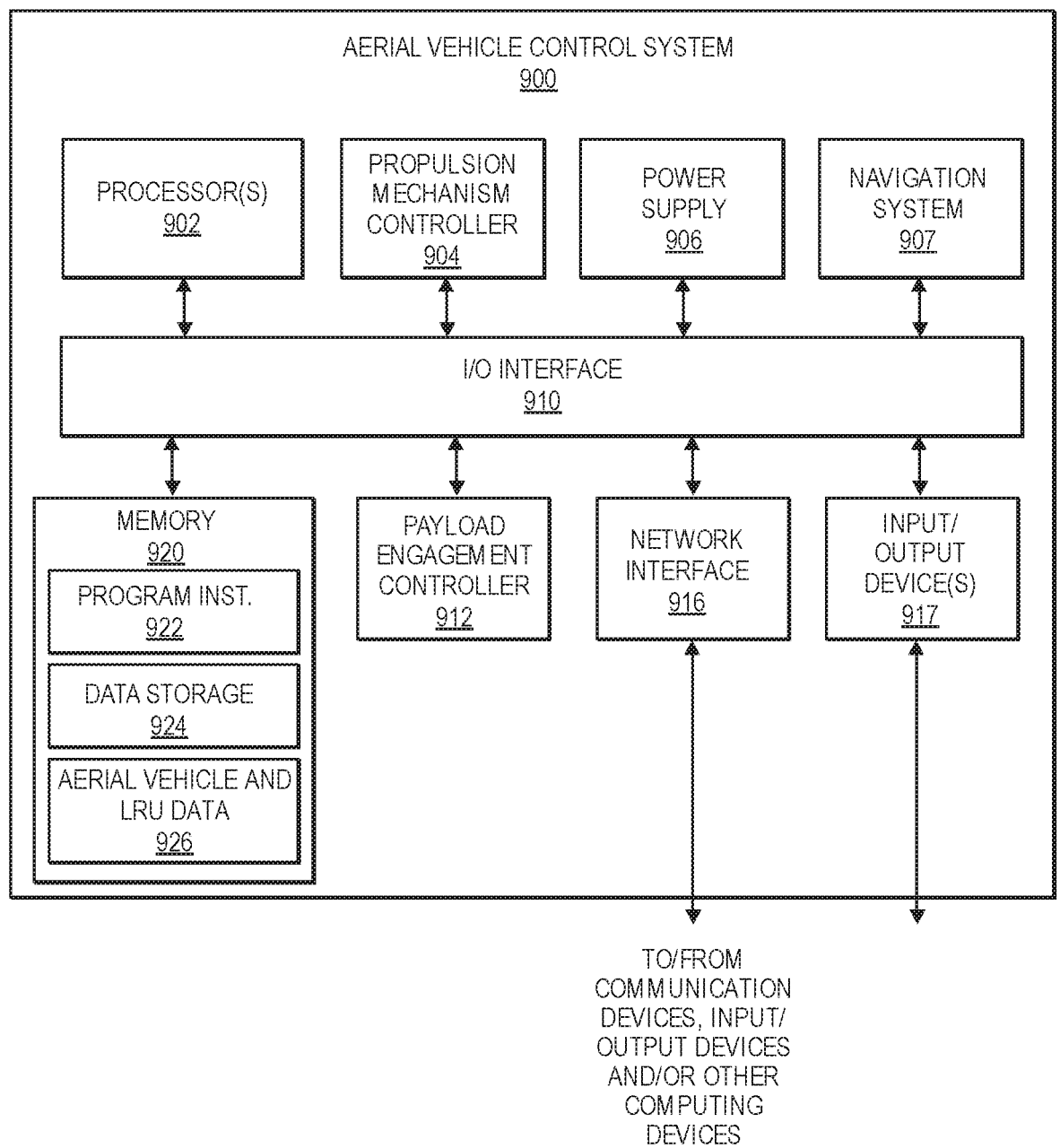
FIG. 9 is a block diagram illustrating various components of an example aerial vehicle control system, in accordance with disclosed implementations.
Figure 10:
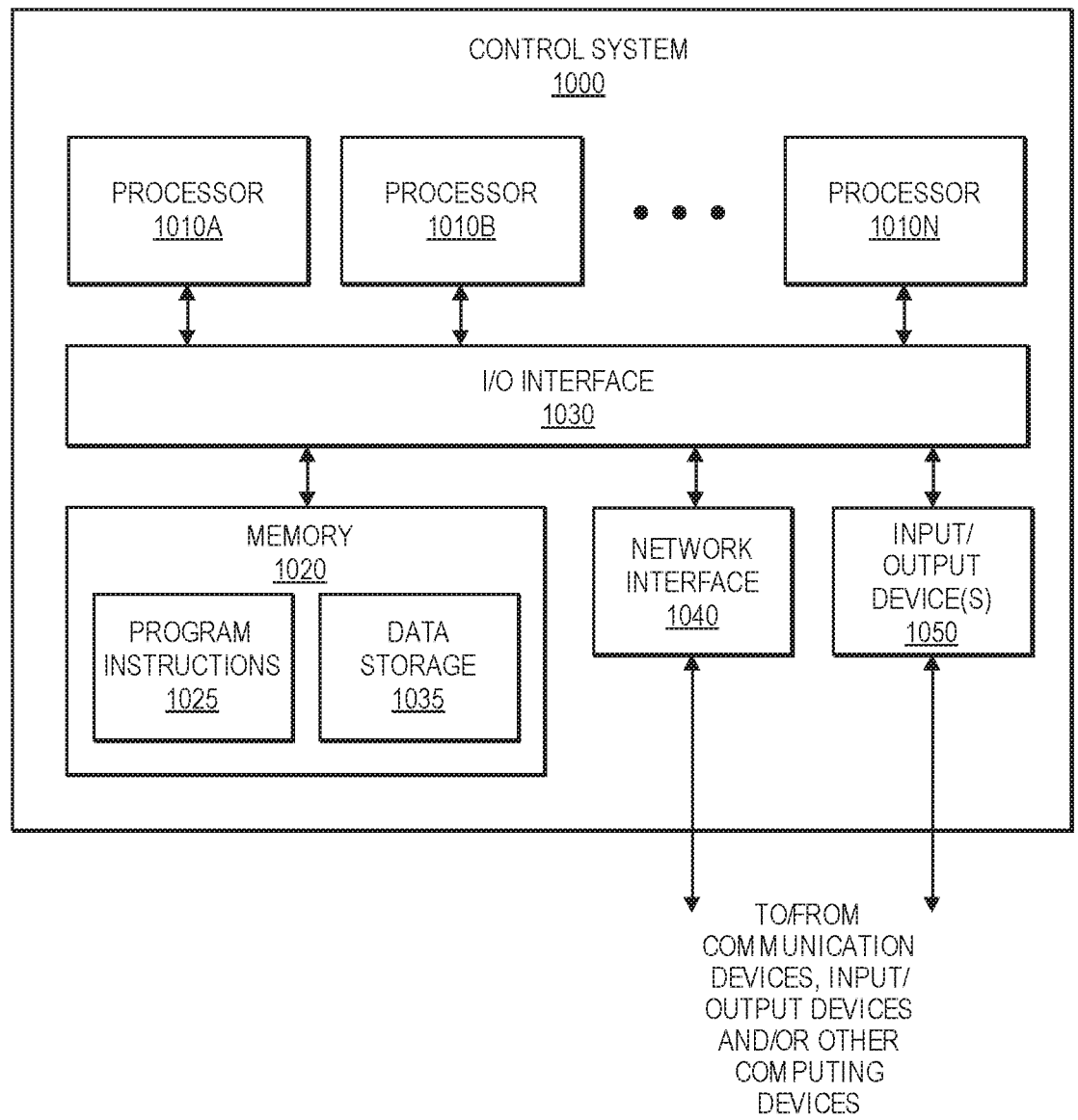
FIG. 10 is a block diagram illustrating various components of an example control system, in accordance with implementations of the present disclosure.

One or more processors, controllers, or control systems, as further described herein with respect to FIGS. 9 and 10, may process the operational data, environmental data, and/or reliability and durability testing data to determine degradation or service profiles of various components of aerial vehicles, e.g., using fault-tree analysis or other data processing techniques or algorithms. The degradation or service profiles may comprise reliability predictions, failure modes, impact, criticality, and/or other aspects associated with various components.

Based on the degradation or service profiles, service frequencies associated with various components may be determined. The service frequencies may comprise respective amounts of time, e.g., times in operation on aerial vehicles, after which the various components should be serviced in order to maintain safe and reliable operations of the components and aerial vehicles. Example service frequencies may include once a week, once a month, once a year, once per flight or mission, once per a particular number of flights or missions, once per a particular number of hours in operation, once per a particular number of occurrences of an operational condition, once per a particular number of occurrences of an environmental condition, and/or various other frequencies.

As described herein, the replaceable components may include various types of components, such as propellers, motors, electronic speed controllers, control servos, control rods, control surfaces, ailerons, landing gear, power supplies, sensors, imaging devices, magnetometers, altimeters, pitot tubes, cables, wires, connectors, antennas, compute boards, or other components. Each replaceable component of the various replaceable components may have an associated service frequency based on the operational data, environmental data, and/or reliability and durability testing data.

Further, a single replaceable component may have multiple different service frequencies based on operational data, environmental data, and/or reliability and durability testing data that is associated with different types of operations, flights, or missions, and/or operations in different environmental conditions. For example, an example replaceable imaging device may have a first service frequency associated with long range flights or missions in bright sunlight and at moderate temperatures, and the same example replaceable imaging device may have a different, second service frequency associated with medium range flights or missions in nighttime and at relatively cold temperatures.

Based at least in part on one or more service frequencies associated with a replaceable component, the replaceable component may be designed for incorporation into an aerial vehicle. For example, based on a type or configuration of the aerial vehicle, an operational profile for the aerial vehicle, and/or an environmental profile for the aerial vehicle, a replaceable component having an associated service frequency, e.g., which may also be determined based on the type or configuration, operational profile, and/or environmental profile for the aerial vehicle, may be designed for incorporation into the aerial vehicle.

The type or configuration of the aerial vehicle may comprise a size, shape, structure, number of propulsion mechanisms, power, current, voltage, speed, acceleration, flight characteristics, or other aspects associated with the type or configuration of the aerial vehicle. The operational profile of the aerial vehicle may comprise operational aspects associated with flights, missions, or other expected or intended operations of the aerial vehicle and its components. The environmental profile of the aerial vehicle may comprise environmental aspects associated with an environment in which the aerial vehicle and its components are expected or intended to fly or operate.

Thus, based at least in part on a service frequency associated with a replaceable component to be incorporated into an aerial vehicle having a type or configuration, operational profile, and/or environmental profile, a location associated with the aerial vehicle may be selected or determined for design and placement of the replaceable component. As described herein, the selected location for the replaceable component on the aerial vehicle may be associated with various portions of an aerial vehicle, such as a body or fuselage, a frame, a propulsion mechanism, a motor arm, a support arm, a stabilizer fin, a wing, a landing gear, or any other portion of an aerial vehicle. In addition, the selected location for the replaceable component on the aerial vehicle may be an outer portion, an inner portion, or any other outer or inner portion of the aerial vehicle.

As shown in FIG. 3, various replaceable components 315, 317, 319, 320 are positioned at respective locations in association with a body or fuselage 310 of an aerial vehicle 300 based at least in part on their respective service frequencies. For example, various sensors 315-1, 315-2, 315-3 may be positioned at locations toward a forward end and at an outer portion of the fuselage 310 based on their respective service frequencies. In addition, a power supply 317-1 may be positioned on an upper side and at an outer portion or surface of the fuselage 310, and two additional sensors 315-4, 315-5 may be stacked underneath the power supply 317-1 based on their respective service frequencies. Further, another power supply 317-2 may be positioned on a lower side and at an outer portion or surface of the fuselage 310, a controller or compute board 319-1 may be stacked underneath the power supply 317-2, and another controller or compute board 319-2 may be further stacked underneath the controller or compute board 319-1 based on their respective service frequencies.

Generally, replaceable components that are positioned toward an outer portion of the fuselage 310 may have relatively higher service frequencies, such that those components may be relatively more accessible and serviced at a higher rate or frequency, i.e., more often, than other components that are positioned toward an inner portion of the fuselage 310. Likewise, replaceable components that are positioned toward an inner portion of the fuselage 310, and/or that are stacked under other replaceable components, may have relatively lower service frequencies, such that those components may be relatively less accessible and serviced at a lower rate or frequency, i.e., less often, than other components that are positioned toward an outer portion of the fuselage 310. Thus, in the example shown in FIG. 3, the power supply 317-2 may have a relatively higher service frequency than the compute board 319-1 that is stacked under it, and the compute board 319-1 may also have a relatively higher service frequency than the compute board 319-2 that is stacked under it. Likewise, the power supply 317-1 may have a relatively higher service frequency than the sensors 315-4, 315-5 that are stacked under it, and the sensors 315-4, 315-5 may have similar or different service frequencies that are each lower than the service frequency of the power supply 317-1 stacked on top of them. In other example embodiments, replaceable components that are stacked relative to each other may generally have the same service frequency, such that all stacked components may be serviced at substantially the same time. In addition, replaceable components that are positioned substantially independently at different locations and that are not stacked relative to each other may have the same or similar service frequency, or may have different service frequencies.

Moreover, a replaceable module 320 housing or containing a plurality of replaceable components may be positioned toward a rear end and at an outer portion of the fuselage 310 based on a respective service frequency of the replaceable module as a whole. The plurality of replaceable components housed within the replaceable module 320 may each have substantially similar service frequencies, e.g., service frequencies that are within a threshold value, percentage, or amount relative to each other, such that they may be housed or contained within a common replaceable module. Further, the replaceable module 320 may include various similar or different types of replaceable components.

Generally, replaceable modules may include a plurality of components, whether of similar or different types, having substantially similar service frequencies, such that the replaceable modules may be serviced as a single unit according to the service frequency of the replaceable module as a whole. A replaceable module may include two or more replaceable components. In some example embodiments, a replaceable module may include similar types of components with similar service frequencies, such as a plurality of power supplies, a plurality of sensors, a plurality of compute boards, etc. In other example embodiments, a replaceable module may include different types of components with similar service frequencies, such as a power supply, a sensor, an imaging device, a compute board, an electronic speed controller, etc.

Furthermore, because replaceable components may have different service frequencies depending upon a type or configuration, an operational profile, and/or an environmental profile associated with an aerial vehicle into which the replaceable components are to be incorporated, particular aerial vehicles having different types or configurations, that may be intended for different operational profiles, and/or that may be expected to experience different environmental profiles may have different configurations or arrangements of replaceable components, including one or more stacks of replaceable components and/or one or more replaceable modules. Thus, aerial vehicles intended for a first set of operations or environments may be designed with a first particular configuration or arrangement of a set of replaceable components, and aerial vehicles intended for a second, different set of operations or environments may be designed with a second, different particular configuration or arrangement of a set of replaceable components, even if the sets of replaceable components are the same or similar for all aerial vehicles.

Although FIG. 3 generally shows and describes replaceable components in relation to a body or fuselage of an aerial vehicle, the one or more replaceable components may be associated with various other portions of an aerial vehicle, such as a body or fuselage, a frame, a propulsion mechanism, a motor arm, a support arm, a stabilizer fin, a wing, a landing gear, or any other portion of an aerial vehicle. In addition, although FIG. 3 shows a particular number, configuration, and arrangement of replaceable components, in various other example embodiments, various different numbers, configurations, and arrangements of replaceable components may be possible, e.g., different locations of components, different numbers of components, different arrangements of stacked components, different locations of replaceable modules, different numbers of replaceable modules, different arrangements of stacked replaceable modules, different arrangements of combinations of stacked replaceable components and stacked replaceable modules, etc.

FIG. 4A illustrates a schematic, perspective view of an example line replaceable unit 425A, in accordance with implementations of the present disclosure, and FIG. 4B illustrates a schematic, perspective view of an example line replaceable unit 425B, in accordance with implementations of the present disclosure.

Based at least in part on a service frequency associated with a replaceable component to be incorporated into an aerial vehicle, which may have a type or configuration, operational profile, and/or environmental profile, and/or based on a selected location associated with the aerial vehicle for design and placement of the replaceable component, a connection type for the replaceable component may also be selected or determined. Various connection types may be selected and designed for incorporation of replaceable components on various portions of aerial vehicles, such as latches, tabs, clips, pins, electrical connections, spring-loaded connections, bayonet connections, other interlocking connections, threaded connections, magnetic connections, and/or various other types of connections. In some example embodiments, latches, tabs, or clips may incorporate features similar to various spring-loaded, biased, or expandable/compressible cable or wire connectors, such as Ethernet, network, and/or telephone cable or wire connectors.

FIG. 4A illustrates an example connection type for example replaceable components, such as electronic speed controllers, control servos, power supplies, sensors, imaging devices, magnetometers, altimeters, antennas, compute boards, or other components. The example replaceable component 425A may include alignment pins 427A-1, 427A-2, an electrical connection interface 428A, and a retention groove or indentation 429A. The portion 435A of the aerial vehicle 400A in which the replaceable component 425A is to be positioned may include alignment slots 437A-1, 437A-2, an electrical connection interface 438A, and a retention latch, tab, or clip 439A, which may form a spring-loaded, interlocking connection with retention groove 429A.

During placement of the replaceable component 425A into the portion 435A of the aerial vehicle 400A, the alignment pins 427A-1, 427A-2 may be aligned and inserted into the alignment slots 437A-1, 437A-2, the electrical connection interface 428A of the replaceable component 425A may be aligned and placed in contact with the electrical connection interface 438A of the portion 435A, and the retention tab 439A may be moved or biased into interlocking engagement with the retention groove 429A of the replaceable component 425A to hold and retain the replaceable component 425A in position in the portion 435A of the aerial vehicle. Various other types of connections may also be included as part of the replaceable components and/or the portions of aerial vehicles that receive replaceable components to provide communication, transmission, and/or receipt of power and/or data, such as electrical connections, electromagnetic connections, radiofrequency connections, optical connections, magnetic connections, and/or inductive connections. During removal of the replaceable component 425A from the portion 435A of the aerial vehicle, the above described steps may be performed substantially in reverse.

FIG. 4B illustrates another example connection type for example replaceable components, such as electronic speed controllers, control servos, power supplies, sensors, imaging devices, magnetometers, altimeters, antennas, compute boards, or other components. The example replaceable component 425B may include electrical connection pins 428B and a retention groove or indentation 429B. The portion 435B of the aerial vehicle 400B in which the replaceable component 425B is to be positioned may include an electrical connection slot 438B and a retention latch, tab, or clip 439B, which may form a spring-loaded, interlocking connection with retention groove 429B.

During placement of the replaceable component 425B into the portion 435B of the aerial vehicle 400B, the electrical connection pins 428B of the replaceable component 425B may be aligned and placed in contact with the electrical connection slot 438B of the portion 435B, and the retention tab 439B may be moved or biased into interlocking engagement with the retention groove 429B of the replaceable component 425B to hold and retain the replaceable component 425B in position in the portion 435B of the aerial vehicle. Various other types of connections may also be included as part of the replaceable components and/or the portions of aerial vehicles that receive replaceable components to provide communication, transmission, and/or receipt of power and/or data, such as electrical connections, electromagnetic connections, radiofrequency connections, optical connections, magnetic connections, and/or inductive connections. During removal of the replaceable component 425B from the portion 435B of the aerial vehicle, the above described steps may be performed substantially in reverse.

In further example embodiments, multiple connection types similar to that described herein with respect to FIGS. 4A and/or 4B may be stacked relative to each other, e.g., with the same or decreasing size for replaceable components that are stacked under other components. In this manner, multiple replaceable components may be removed and replaced using stacked connection types associated with a portion of an aerial vehicle.

Figure 5C:
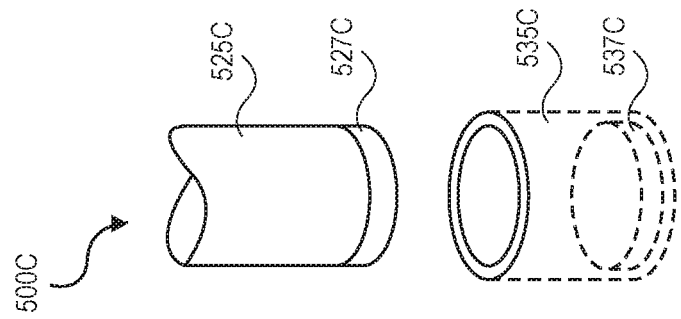
FIG. 5C illustrates a schematic, perspective view of an example line replaceable unit, in accordance with implementations of the present disclosure.
Figure 5B:
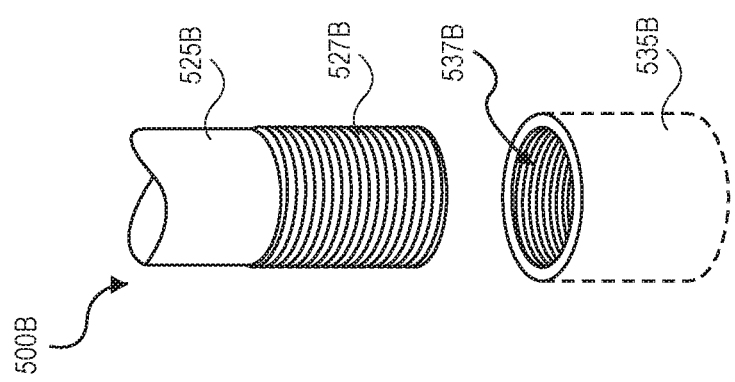
FIG. 5B illustrates a schematic, perspective view of an example line replaceable unit, in accordance with implementations of the present disclosure.
Figure 5A:
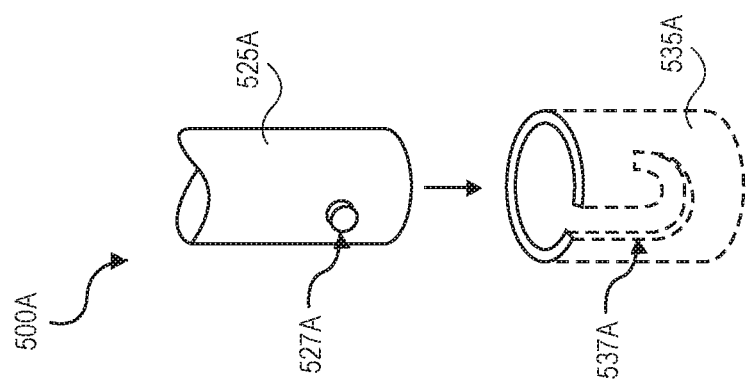
FIG. 5A illustrates a schematic, perspective view of an example line replaceable unit, in accordance with implementations of the present disclosure.

FIG. 5A illustrates a schematic, perspective view of an example line replaceable unit 525A, in accordance with implementations of the present disclosure, FIG. 5B illustrates a schematic, perspective view of an example line replaceable unit 525B, in accordance with implementations of the present disclosure, and FIG. 5C illustrates a schematic, perspective view of an example line replaceable unit 525C, in accordance with implementations of the present disclosure.

FIG. 5A illustrates an example connection type for example replaceable components, such as propellers, motors, electronic speed controllers, control servos, control rods, control surfaces, ailerons, landing gear, power supplies, sensors, imaging devices, magnetometers, altimeters, pitot tubes, cables, wires, connectors, antennas, compute boards, or other components. The example replaceable component 525A may include an attachment pin 527A. The portion 535A of the aerial vehicle 500A in which the replaceable component 525A is to be positioned may include an attachment slot 537A, which may form a bayonet connection with the attachment pin 527A.

During placement of the replaceable component 525A into the portion 535A of the aerial vehicle 500A, the attachment pin 527A of the replaceable component 525A may be aligned, inserted, and rotated into interlocking engagement with the attachment slot 537A of the portion 535A to hold and retain the replaceable component 525A in position in the portion 535A of the aerial vehicle. During removal of the replaceable component 525A from the portion 535A of the aerial vehicle, the above described steps may be performed substantially in reverse.

FIG. 5B illustrates another example connection type for example replaceable components, such as propellers, motors, electronic speed controllers, control servos, control rods, control surfaces, ailerons, landing gear, power supplies, sensors, imaging devices, magnetometers, altimeters, pitot tubes, cables, wires, connectors, antennas, compute boards, or other components. The example replaceable component 525B may include a first threaded element 527B. The portion 535B of the aerial vehicle 500B in which the replaceable component 525B is to be positioned may include a second threaded element 537B, which may form a threaded connection with the first threaded element 527B.

During placement of the replaceable component 525B into the portion 535B of the aerial vehicle 500B, the first threaded element 527B of the replaceable component 525B may be aligned, inserted, and rotated into interlocking engagement with the second threaded element 537B of the portion 535B to hold and retain the replaceable component 525B in position in the portion 535B of the aerial vehicle. During removal of the replaceable component 525B from the portion 535B of the aerial vehicle, the above described steps may be performed substantially in reverse.

FIG. 5C illustrates a further example connection type for example replaceable components, such as propellers, motors, electronic speed controllers, control servos, control rods, control surfaces, ailerons, landing gear, power supplies, sensors, imaging devices, magnetometers, altimeters, pitot tubes, cables, wires, connectors, antennas, compute boards, or other components. The example replaceable component 525C may include a first magnetic element 527C. The portion 535C of the aerial vehicle 500C in which the replaceable component 525C is to be positioned may include a second magnetic element 537C, which may form a magnetic connection with the first magnetic element 527C.

During placement of the replaceable component 525C into the portion 535C of the aerial vehicle 500C, the first magnetic element 527C of the replaceable component 525C may be aligned and inserted into magnetic engagement with the second magnetic element 537C of the portion 535C to hold and retain the replaceable component 525C in position in the portion 535C of the aerial vehicle. During removal of the replaceable component 525C from the portion 535C of the aerial vehicle, the above described steps may be performed substantially in reverse.

In further example embodiments, multiple connection types similar to that described herein with respect to FIGS. 4A-5C may be stacked relative to each other, e.g., with the same or decreasing size for replaceable components that are stacked under other components. In this manner, multiple replaceable components may be removed and replaced using stacked connection types associated with a portion of an aerial vehicle.

Although FIGS. 4A-5C show and describe particular shapes, sizes, configurations, or arrangements of connection types, in other example embodiments, various elements of different connection types may be combined and/or modified in different combinations to form various other connection types having other shapes, sizes, configurations, or arrangements. As described herein, the various connection types that may be selected and designed for incorporation of replaceable components on various portions of aerial vehicles may include various combinations of latches, tabs, clips, pins, electrical connections, spring-loaded connections, bayonet connections, other interlocking connections, threaded connections, magnetic connections, and/or various other types of connections.

Moreover, various replaceable components may be associated with one or more service types. Example service types may include different types of service or maintenance to be performed with respect to replaceable components, such as cleaning a replaceable component, removing a replaceable component, replacing a replaceable component, modifying a replaceable component, updating software or firmware of a replaceable component, running a test of a replaceable component, calibrating a replaceable component, and/or other types of service or maintenance.

Furthermore, various replaceable components may be associated with one or more service agents. Example service agents may include robotic service agents or machines, automated service agents or machines, semi-automated service agents or machines, human service agents, and/or other types of service agents. Example robotic, automated, or semi-automated service agents or machines may comprise robotic arms, gantry systems, automated equipment or machinery, robotic arms on rail systems, automated equipment on rail systems, conveyance systems, or others. The example service agents may be associated with various service stations within one or more service or maintenance facilities. In addition, the example service agents may transport aerial vehicles and replaceable components between service stations, and/or the example service agents may perform various types of service, as described herein, with respect to particular components and aerial vehicles.

In some example embodiments, a location and/or a connection type associated with a replaceable component may be further selected or designed based on a service type and/or a service agent. For example, a location and/or a connection type for a replaceable component may be selected to facilitate easy removal or replacement, to facilitate simple software updating or calibration, to facilitate quick cleaning, and/or to facilitate other service types. In addition, a location and/or a connection type for a replaceable component may also be selected to facilitate service or maintenance operations by a robotic service agent, by an automated service agent, by a human service agent, and/or by other types of service agents.

Based on the selected or designed location, connection type, service agent, and/or service type for a replaceable component, the replaceable component may be designed for placement at the selected location with the selected connection type on the portion of the aerial vehicle. In this manner, because the location, connection type, service agent, and/or service type for replaceable components are selected and designed based at least in part on respective service frequencies associated with the replaceable components, the replaceable components associated with the aerial vehicle may be more easily accessible to facilitate quick, reliable, and efficient service and maintenance of components of aerial vehicles, thereby ensuring safe and reliable operation of aerial vehicles.

Further, the service and maintenance of aerial vehicles may be more efficiently determined, scheduled, and performed on various replaceable components of aerial vehicles because the replaceable components are intentionally designed and placed at portions of aerial vehicles to facilitate quick, reliable, and efficient service and maintenance of components of aerial vehicles over time. As a result, one or more facilities having service stations to service and maintain replaceable components of aerial vehicles may be further designed based at least in part on the service frequencies of respective replaceable components of aerial vehicles. For example, the service stations may be ordered and positioned such that replaceable components, including replaceable components that are stacked relative to each other as well as replaceable modules including a plurality of components, may be serviced by particular service stations in a predetermined order or sequence according to their service frequencies.

Although the description herein generally describes designating and designing replaceable components for incorporation into aerial vehicles to facilitate efficient and reliable service or maintenance of the replaceable components of aerial vehicles, it is understood that various other design considerations and/or constraints may also be taken into account in addition to the factors and considerations related to service or maintenance described herein. Such other design considerations or constraints may relate to space or volume considerations or constraints associated with particular components and aerial vehicles, operational or functional considerations or constraints associated with particular components and aerial vehicles, manufacturing considerations or constraints associated with particular components and aerial vehicles, assembly considerations or constraints associated with particular components and aerial vehicles, and/or various other types of design considerations or constraints.

Figure 6:
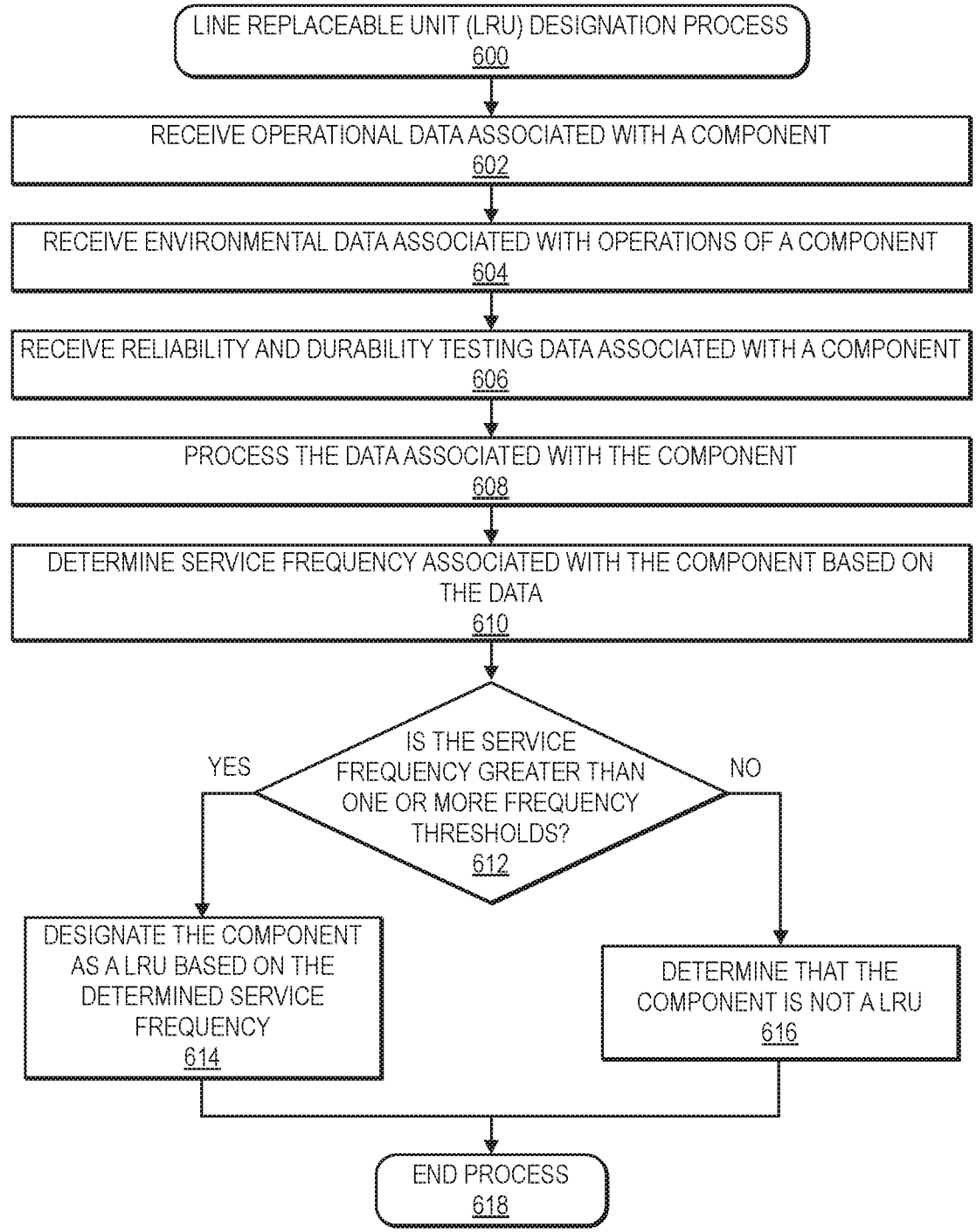
FIG. 6 is a flow diagram illustrating an example line replaceable unit designation process, in accordance with implementations of the present disclosure.

FIG. 6 is a flow diagram illustrating an example line replaceable unit designation process 600, in accordance with implementations of the present disclosure.

The process 600 may begin by receiving operational data associated with a component, as at 602. For example, operational data may be received from flight or mission data of an aerial vehicle having the component. In addition, operational data may be received from flight or mission data of a plurality of aerial vehicles having the same or similar components. Further, operational data may include data related to normal, regular, or systematic operations or maintenance schedules and/or may include data related to unscheduled, irregular, random, or nonsystematic inspection, testing, or service responsive to various changes, faults, errors, or other events associated with the components. The operational data may comprise various aspects associated with operations of the component, such as rotational speed, current, voltage, power, temperature, movement, force, load, faults, errors, and/or any other data associated with operations of the component. Further, a processor, controller, or control system may receive operational data associated with a component.

The process 600 may continue by receiving environmental data associated with operations of a component, as at 604. For example, environmental data may be received from flight or mission data of an aerial vehicle having the component. In addition, environmental data may be received from flight or mission data of a plurality of aerial vehicles having the same or similar components. The environmental data may comprise various aspects associated with operations of the component, such as weather variations, temperature variations, humidity changes, wind gusts, rain, snow, precipitation, particulates, sunlight, ultraviolet radiation, external forces, impacts or collisions, and/or any other environmental conditions experienced by the component. Further, a processor, controller, or control system may receive environmental data associated with operations of a component.

The process 600 may proceed by receiving reliability and durability testing data associated with a component, as at 606. For example, reliability and durability testing data may be received from testing data associated with the component, a plurality of the components, and/or one or more aerial vehicles having the components. Further, reliability and durability testing data may include data related to normal, regular, or systematic operations or maintenance schedules and/or may include data related to unscheduled, irregular, random, or nonsystematic inspection, testing, or service responsive to various changes, faults, errors, or other events associated with the components. The reliability and durability testing data of components and aerial vehicles may comprise various aspects associated with testing of the component, such as mechanical testing, force or load testing, vibration testing, impact testing, electrical testing, current, voltage, or power testing, temperature testing, life cycle testing, and/or any other testing data associated with the component. Further, a processor, controller, or control system may receive reliability and durability testing data associated with a component.

The process 600 may then continue to process the data associated with the component, as at 608. For example, the operational data, the environmental data, and/or the testing data may be processed to determine degradation or service profiles associated with the component. The data processing may comprise fault-tree analysis and/or other data processing techniques or algorithms. The degradation or service profiles may comprise reliability predictions, failure modes, impact, criticality, and/or other aspects associated with the component. Further, a processor, controller, or control system may process the data associated with the component to determine degradation or service profiles associated with the component.

The process 600 may then proceed to determine a service frequency associated with the component based on the data, as at 610. For example, based on the processing and analysis of the operational data, the environmental data, and/or the testing data associated with the component, and further based on the degradation or service profile determined for the component, one or more service frequencies associated with the component may be determined. The service frequency may comprise a frequency at which the component should be serviced or maintained, such as once a week, once a month, once a year, once per flight or mission, once per a particular number of flights or missions, once per a particular number of hours in operation, once per a particular number of occurrences of an operational condition, once per a particular number of occurrences of an environmental condition, and/or various other frequencies. Further, a processor, controller, or control system may determine a service frequency associated with the component based on the data.

As described above, a single component may have a plurality of different service frequencies that may depend upon aspects of an aerial vehicle into which the component may be incorporated, such as a type or configuration, an operational profile, and/or an environmental profile of the aerial vehicle. For example, a single component may have a first service frequency if incorporated into a first aerial vehicle with a first operational profile and/or first environmental profile, and the same, single component may have a second, different service frequency if incorporated into a second aerial vehicle with a second operational profile and/or second environmental profile.

The process 600 may then continue with determining whether the service frequency of the component is greater than one or more frequency thresholds, as at 612. For example, the service frequency associated with the component may be compared with one or more frequency thresholds that may be associated with particular service or maintenance schedules of components and/or aerial vehicles, and/or that may be associated with service frequencies of various other components of aerial vehicles. If the service frequency associated with the component is greater than one or more frequency thresholds, the component may be designated as a line replaceable unit (LRU), or replaceable component, based on the determined service frequency, as at 614. If, however, the service frequency associated with the component is not greater than one or more frequency thresholds, it may be determined that the component is not a line replaceable unit (LRU), or replaceable component, as at 616. Further, a processor, controller, or control system may determine whether the service frequency of the component is greater than one or more frequency thresholds, and may determine whether to designate a component as a LRU, or replaceable component.

For components that are designated as LRUs, or replaceable components, the replaceable components may be grouped into different levels or tiers of replaceable components based on their determined service frequencies. For example, replaceable components having service frequencies that are greater than a highest frequency threshold may be grouped together in a highest frequency tier, and such replaceable components may generally be selected and designed for greatest or easiest accessibility on an aerial vehicle, e.g., at an outer portion of an aerial vehicle, in order to facilitate service or maintenance at their determined high service frequencies. In addition, replaceable components having service frequencies that are greater than one or more lower frequency thresholds may be grouped together in lower frequency tiers, and such replaceable components may generally be selected and designed for moderate or standard accessibility on an aerial vehicle, e.g., at an outer portion or various levels of inner portions of an aerial vehicle and/or stacked under one or more other replaceable components, in order to facilitate service or maintenance at their determined moderate service frequencies. Moreover, components that are grouped together in individual frequency tiers may be grouped together in a replaceable module that may be selected and designed for removal, replacement, or other service together as a single unit as part of the replaceable module.

Further, components that are not designated as LRUs, or replaceable components, because they have service frequencies that are not greater than one or more frequency thresholds may be grouped together in a lowest frequency tier, and such components may generally be selected and designed for least or difficult accessibility on an aerial vehicle, e.g., at an inner portion of an aerial vehicle and/or stacked under one or more other components, in order to facilitate service or maintenance at their determined low service frequencies.

After designating one or more components as being LRUs, or replaceable components, and/or after designating one or more components as not being LRUs, or replaceable components, the process 600 may then end, as at 618.

By the process described with respect to FIG. 6, various components of an aerial vehicle may be designated as LRUs, or replaceable components, based at least in part on operational data, environmental data, and/or testing data associated with the various components. Then, based on the designation of LRUs, or replaceable components, such replaceable components may be designed for incorporation into aerial vehicles to facilitate service or maintenance of such replaceable components over time, as described with respect to FIG. 7.

Figure 7:
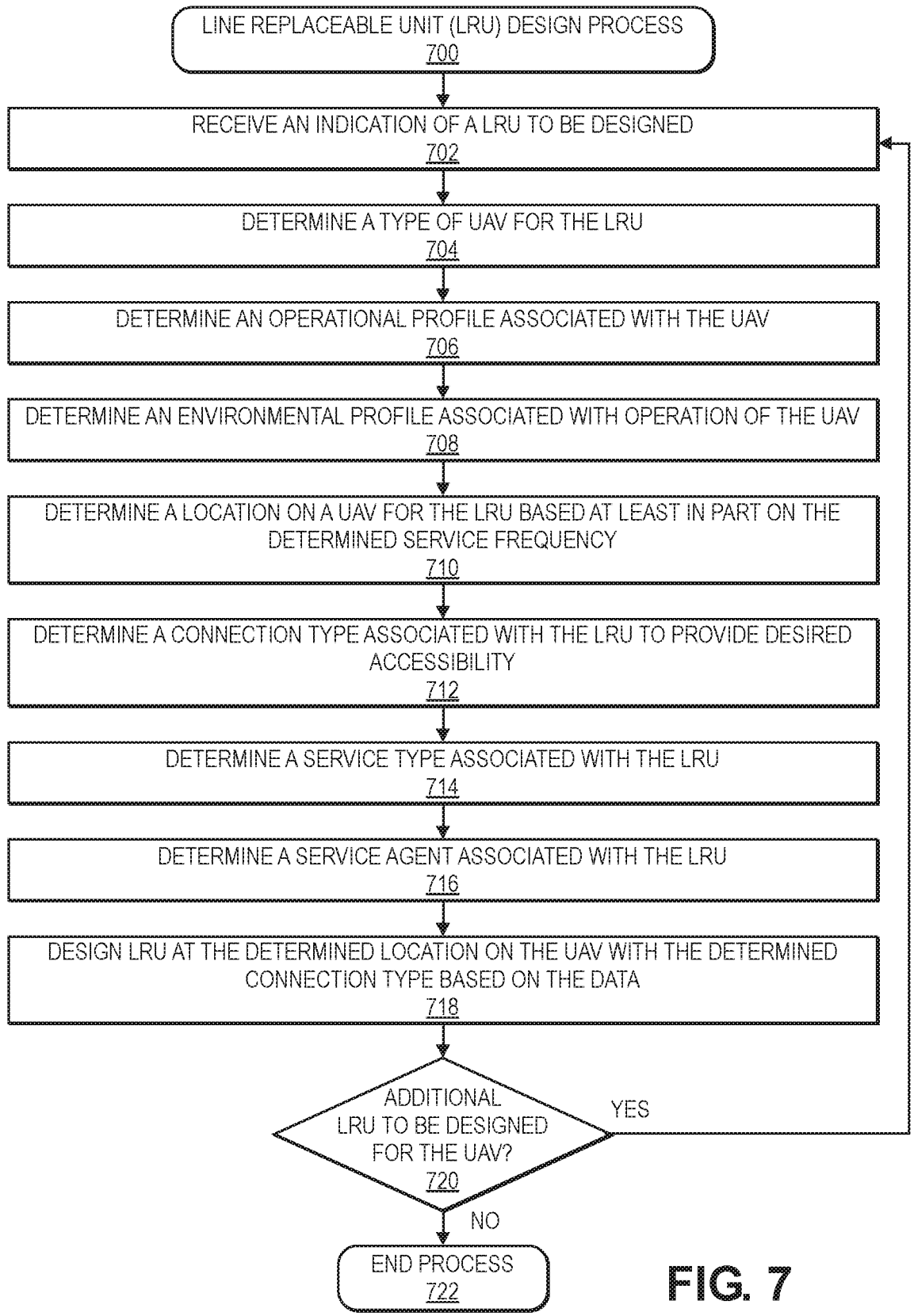
FIG. 7 is a flow diagram illustrating an example line replaceable unit design process, in accordance with implementations of the present disclosure.

FIG. 7 is a flow diagram illustrating an example line replaceable unit design process 700, in accordance with implementations of the present disclosure.

The process 700 may begin by receiving an indication of an LRU to be designed, as at 702. For example, a particular LRU, or replaceable component, may be desired for incorporation into an aerial vehicle. The replaceable components may include various types of components, such as propellers, motors, electronic speed controllers, control servos, control rods, control surfaces, ailerons, landing gear, power supplies, sensors, imaging devices, magnetometers, altimeters, pitot tubes, cables, wires, connectors, antennas, compute boards, or other components. Further, a processor, controller, or control system may receive an indication of a replaceable component to be designed.

The process 700 may continue by determining a type or configuration of the unmanned aerial vehicle (UAV) for the LRU, as at 704. For example, the type or configuration may include various aspects related to the aerial vehicle, such as a size, shape, structure, number of propulsion mechanisms, power, current, voltage, speed, acceleration, flight characteristics, or other aspects associated with the type or configuration of the aerial vehicle. Further, a processor, controller, or control system may determine a type or configuration of an aerial vehicle to incorporate the replaceable component.

The process 700 may proceed by determining an operational profile associated with the UAV, as at 706. For example, the operational profile may include various aspects of operations of the aerial vehicle, such as aspects of expected or intended flights or missions, or other expected or intended operations of the aerial vehicle and its components, as well as various aspects associated with expected or intended operations of the component, such as rotational speed, current, voltage, power, temperature, movement, force, load, faults, errors, and/or any other aspects associated with operations of the component. Further, a processor, controller, or control system may determine an operational profile associated with the aerial vehicle.

The process 700 may continue to determine an environmental profile associated with operation of the UAV, as at 708. For example, the environmental profile may include various aspects of environmental factors to be experienced by the aerial vehicle, such as aspects associated with an environment in which the aerial vehicle is expected or intended to fly or operate, as well as various aspects associated with expected or intended operations of the component, such as weather variations, temperature variations, humidity changes, wind gusts, rain, snow, precipitation, particulates, sunlight, ultraviolet radiation, external forces, impacts or collisions, and/or any other environmental conditions to be experienced by the component. Further, a processor, controller, or control system may determine an environmental profile associated with operation of the aerial vehicle.

The process 700 may then proceed to determine a location on a UAV for the LRU based at least in part on the determined service frequency, as at 710. For example, based at least in part on the type or configuration, operational profile, and/or environmental profile associated with an aerial vehicle, a service frequency associated with an LRU, or replaceable component, may be determined. Then, based at least in part on the determined service frequency, a location on the aerial vehicle to incorporate the replaceable component may be determined. As described herein, a replaceable component having a relatively high service frequency may generally be positioned at a location at an outer portion of an aerial vehicle, e.g., to provide improved or greater accessibility for service or maintenance, and a replaceable component having a relatively low service frequency may generally be positioned at a location at an inner portion of an aerial vehicle or stacked under one or more other replaceable components, e.g., to provide moderate or lesser accessibility for service or maintenance. Further, replaceable components having similar service frequencies may be grouped together to form a replaceable module that may be placed at a determined location of an aerial vehicle based at least in part on the service frequency of the replaceable module as a whole. Further, a processor, controller, or control system may determine a location on the aerial vehicle for the replaceable component based on at least in part on the determined service frequency.

In some example embodiments, the location may be determined based at least in part on a connection type, a service type, and/or a service agent associated with the replaceable component. For example, a particular connection type, e.g., latch, threaded, magnetic, etc., may affect the available locations at which the replaceable component may be placed, a particular service type, e.g., cleaning, removing, updating, testing, etc., may affect the available locations at which the replaceable component may be placed, and/or a particular service agent, e.g., robotic, human, etc., may affect the available locations at which the replaceable component may be placed.

The process 700 may then continue with determining a connection type associated with the LRU to provide desired accessibility, as at 712. For example, based at least in part on the determined location of the LRU, or replaceable component, a connection type for placement of the replaceable component at the determined location may be determined. As described herein, the connection type may include various types of connections, such as latches, tabs, clips, pins, electrical connections, spring-loaded connections, bayonet connections, other interlocking connections, threaded connections, magnetic connections, and/or various other types of connections. Further, a processor, controller, or control system may determine a connection type associated with a replaceable component to provide desired accessibility.

In some example embodiments, the connection type may be determined based at least in part on a location, a service type, and/or a service agent associated with the replaceable component. For example, a particular location, e.g., outer portion, inner portion, stacked, etc., may affect the available connection types with which the replaceable component may be attached or retained, a particular service type, e.g., cleaning, removing, updating, testing, etc., may affect the available connection types with which the replaceable component may be attached or retained, and/or a particular service agent, e.g., robotic, human, etc., may affect the available connection types with which the replaceable component may be attached or retained.

The process 700 may then proceed with determining a service type associated with the LRU, as at 714. For example, as described herein, the service type may comprise various different types of service or maintenance, such as cleaning a replaceable component, removing a replaceable component, replacing a replaceable component, modifying a replaceable component, updating software or firmware of a replaceable component, running a test of a replaceable component, calibrating a replaceable component, and/or other types of service or maintenance. Further, a processor, controller, or control system may determine a service type associated with a replaceable component.

In some example embodiments, the service type may be determined based at least in part on a location, a connection type, and/or a service agent associated with the replaceable component. For example, a particular location, e.g., outer portion, inner portion, stacked, etc., may affect the available service types with which the replaceable component may be serviced or maintained, a particular connection type, e.g., latch, threaded, magnetic, etc., may affect the available service types with which the replaceable component may be serviced or maintained, and/or a particular service agent, e.g., robotic, human, etc., may affect the available service types with which the replaceable component may be serviced or maintained.

The process 700 may then continue by determining a service agent associated with the LRU, as at 716. For example, as described herein, the service agent may comprise various different types of service agents, such as robotic service agents or machines, automated service agents or machines, semi-automated service agents or machines, human service agents, and/or other types of service agents. Further, a processor, controller, or control system may determine a service agent associated with a replaceable component.

In some example embodiments, the service agent may be determined based at least in part on a location, a connection type, and/or a service type associated with the replaceable component. For example, a particular location, e.g., outer portion, inner portion, stacked, etc., may affect the available service agents by which the replaceable component may be serviced or maintained, a particular connection type, e.g., latch, threaded, magnetic, etc., may affect the available service agents by which the replaceable component may be serviced or maintained, and/or a particular service type, e.g., cleaning, removing, updating, testing, etc., may affect the available service agents by which the replaceable component may be serviced or maintained.

The process 700 may then proceed by designing the LRU at the determined location on the UAV with the determined connection type based on the data, as at 718. For example, based at least in part on the service frequency associated with the component, which may be further based on the type or configuration, operational profile, and/or environmental profile associated with the aerial vehicle onto which the replaceable component is to be incorporated, the replaceable component may be designed for placement at the determined location with the determined connection type. In addition, the service type and/or service agent associated with the replaceable component may also be determined based on the data. Further, as described herein, the location, connection type, service type, and/or service agent may be selected or determined at least partially dependent upon each other. Further, a processor, controller, or control system may instruct, or perform, design and placement of the replaceable component at the determined location on the aerial vehicle with the determined connection type based on the data.

The process 700 may continue to determine whether an additional LRU is to be designed for the UAV, as at 720. If one or more additional replaceable components are to be designed for incorporation into the aerial vehicle, the process 700 may return to step 702 and repeat the steps as described herein. If, however, no additional replaceable components are to be designed for incorporation into the aerial vehicle, the process 700 may then end, as at 722. Further, a processor, controller, or control system may determine whether an additional replaceable component is to be designed for the aerial vehicle.

By the process described with respect to FIG. 7, various LRUs, or replaceable components, may be designed for incorporation into an aerial vehicle, based at least in part on respective service frequencies associated with the replaceable components. As a result, the replaceable components may be designed at particular locations, e.g., outer portions, inner portions, stacked, etc., may be designed with particular connection types, e.g., latch, threaded, magnetic, etc., may be designed for particular service types, e.g., cleaning, removing, updating, testing, etc., and/or may be designed for particular service agents, e.g., robotic, human, etc. Then, because of the design and incorporation of LRUs, or replaceable components, onto aerial vehicles based on their respective service frequencies, facilities with one or more service stations may service or maintain such replaceable components using efficient and reliable processes over time, as described with respect to FIG. 8.

Figure 8:
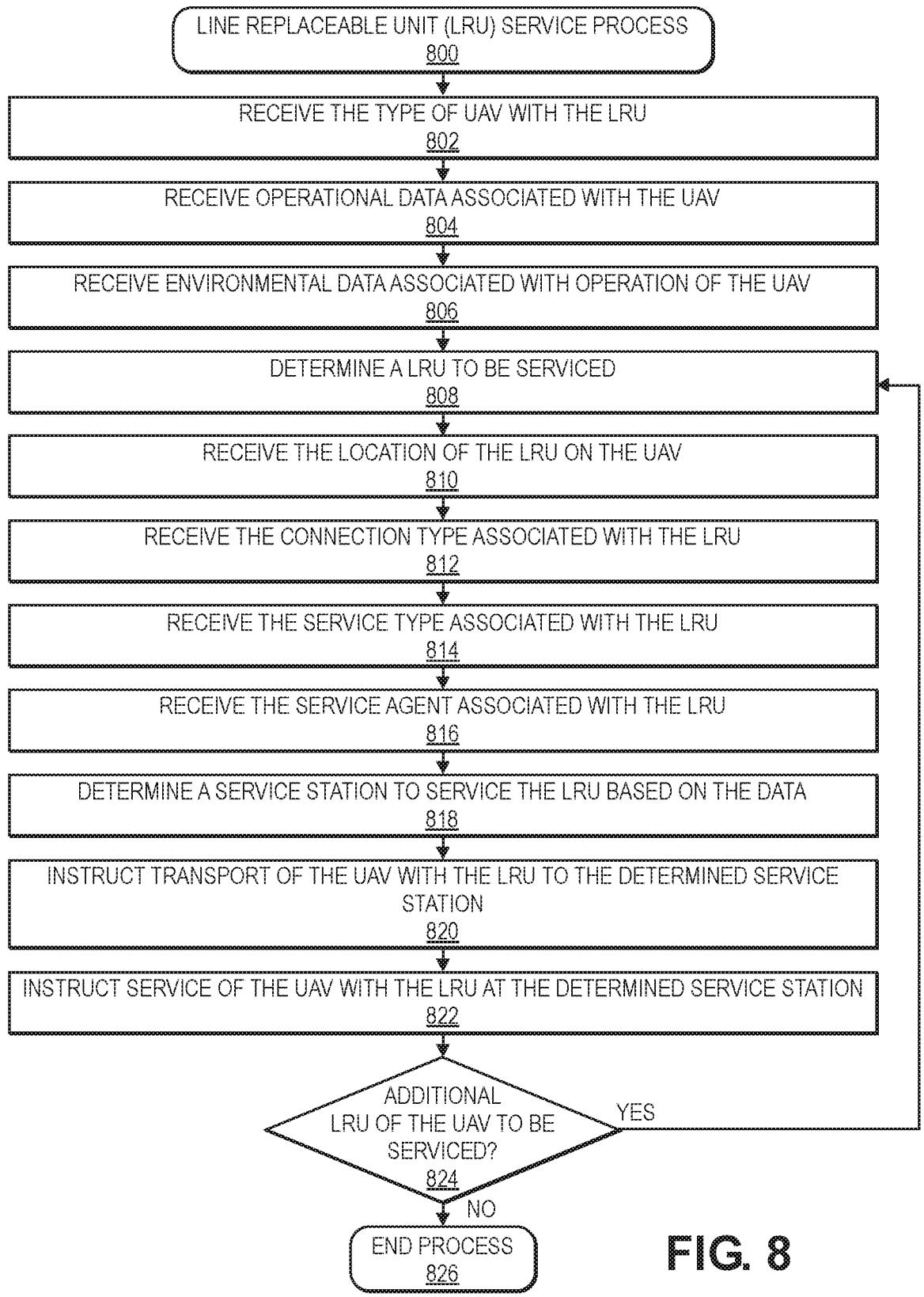
FIG. 8 is a flow diagram illustrating an example line replaceable unit service process, in accordance with implementations of the present disclosure.

FIG. 8 is a flow diagram illustrating an example line replaceable unit service process 800, in accordance with implementations of the present disclosure.

The process 800 may begin by receiving a type or configuration of an unmanned aerial vehicle (UAV) having at least one LRU, as at 802. For example, the type or configuration may include various aspects related to the aerial vehicle, such as a size, shape, structure, number of propulsion mechanisms, power, current, voltage, speed, acceleration, flight characteristics, or other aspects associated with the type or configuration of the aerial vehicle having at least one replaceable component. Further, a processor, controller, or control system may receive a type or configuration of an aerial vehicle having at least one replaceable component.

The process 800 may continue by receiving operational data associated with the UAV, as at 804. For example, operational data may be associated with one or more flights, missions, or other operations performed by the aerial vehicle having at least one replaceable component. Further, operational data may include data related to normal, regular, or systematic operations or maintenance schedules and/or may include data related to unscheduled, irregular, random, or nonsystematic inspection, testing, or service responsive to various changes, faults, errors, or other events associated with the components. The operational data may comprise various aspects associated with operations of the aerial vehicle having at least one replaceable component, such as rotational speed, current, voltage, power, temperature, movement, force, load, faults, errors, and/or any other data associated with operations of the aerial vehicle having at least one replaceable component. Further, a processor, controller, or control system may receive operational data associated with the aerial vehicle.

The process 800 may proceed by receiving environmental data associated with operation of the UAV, as at 806. For example, environmental data may be associated with one or more flights, missions, or other operations performed by the aerial vehicle having at least one replaceable component. The environmental data may comprise various aspects associated with operations of the aerial vehicle having at least one replaceable component, such as weather variations, temperature variations, humidity changes, wind gusts, rain, snow, precipitation, particulates, sunlight, ultraviolet radiation, external forces, impacts or collisions, and/or any other environmental conditions experienced by the aerial vehicle having at least one replaceable component. Further, a processor, controller, or control system may receive environmental data associated with operation of the aerial vehicle.

The process 800 may continue to determine a LRU to be serviced, as at 808. For example, based on the type or configuration, operational data, and/or environmental data associated with the aerial vehicle, it may be determined whether one or more replaceable components of the aerial vehicle have reached or exceeded their respective service frequencies. As described herein, a service frequency may comprise a frequency at which the component should be serviced or maintained, such as once a week, once a month, once a year, once per flight or mission, once per a particular number of flights or missions, once per a particular number of hours in operation, once per a particular number of occurrences of an operational condition, once per a particular number of occurrences of an environmental condition, and/or various other frequencies. Further, a processor, controller, or control system may determine a replaceable component to be serviced. For each replaceable component that is determined to have reached or exceeded its respective service frequency, the process 800 may proceed with the following steps 810-822.

For example, the process 800 may receive a location of the LRU on the UAV, as at 810, may receive a connection type associated with the LRU, as at 812, may receive a service type associated with the LRU, as at 814, and/or may receive a service agent associated with the LRU, as at 816. As described herein, a LRU, or replaceable component, may be designed at a particular location with a particular connection type, and may be associated with a particular service type and service agent. Further, a processor, controller, or control system may receive the location, connection type, service type, and/or service agent associated with the replaceable component.

The process 800 may then proceed to determine a service station to service the LRU based on the data, as at 818. For example, based at least in part on the location, connection type, service type, and/or service agent associated with the replaceable component, a service station, from among a plurality of service stations in a maintenance facility, may be selected to perform the service or maintenance on the replaceable component. The selected service station may be equipped or qualified to perform the service type by the service agent at the location on the aerial vehicle and with the connection type associated with the replaceable component. Further, a processor, controller, or control system may determine a service station to service the replaceable component based on the data.

The process 800 may then continue with instructing transport of the UAV with the LRU to the determined service station, as at 820. For example, one or more service agents, e.g., robotic, human, etc., may transport the aerial vehicle having the replaceable component that is to be serviced to the selected service station. Further, a processor, controller, or control system may instruct transport of the aerial vehicle with the replaceable component to the determined service station.

The process 800 may then proceed with instructing service of the UAV with the LRU at the determined service station, as at 822. For example, one or more service agents, e.g., robotic, human, etc., may be instructed to perform the service type, e.g., cleaning, removal, updating, testing, calibrating, etc., on the aerial vehicle having the replaceable component at the selected service station. Further, a processor, controller, or control system may instruct service of the aerial vehicle with the replaceable component at the determined service station.

The process 800 may continue to determine whether an additional LRU is to be serviced for the UAV, as at 824. If one or more additional replaceable components are to be serviced for the aerial vehicle, the process 800 may return to step 808 and repeat the steps as described herein. If, however, no additional replaceable components are to be serviced for the aerial vehicle, the process 800 may then end, as at 826. Further, a processor, controller, or control system may determine whether an additional replaceable component is to be serviced for the aerial vehicle.

In some example embodiments, one or more service stations to perform service or maintenance on a plurality of replaceable components may be selected or determined together, in sequence, or substantially concurrently, and before instructing transport and instructing service of any of the plurality of replaceable components. In other words, steps 808-818 of the process 800 may be repeatedly performed for a plurality of replaceable components of an aerial vehicle before instructing transport and instructing service of any of the plurality of replaceable components. In this manner, transport of an aerial vehicle having a plurality of replaceable components, as well as service to be performed on a plurality of replaceable components, may be scheduled, sequenced, or ordered to facilitate efficient and reliable service or maintenance at one or more selected service stations.

For example, for replaceable components (and/or replaceable modules) that may be independently accessed and serviced, one or more service stations to perform the service for each of the replaceable components may be selected such that service for each of the replaceable components may be scheduled, sequenced, and performed at the same service station. Alternatively, one or more service stations to perform the service for one or more subsets of the replaceable components and one or more other service stations to perform the service for one or more other subsets of the replaceable components may be selected such that service for each of the replaceable components may be scheduled, sequenced, and performed at different respective service stations.

In addition, for stacked replaceable components (and/or replaceable modules) that are to be serviced, one or more service stations to perform the service for each of the stacked replaceable components may be selected such that service for outer, stacked replaceable components may be at least partially performed, and service for inner, stacked replaceable components may be performed during the service performed for outer, stacked replaceable components, e.g., after outer, stacked replaceable components are removed to provide access to inner, stacked replaceable components. Further, service for stacked replaceable components may be performed at the same service station, or service for stacked replaceable components may be performed at different service stations, e.g., a first service station to perform service for outer, stacked replaceable components, and a second service station to perform service for inner, stacked replaceable components.

By the process described with respect to FIG. 8, various LRUs, or replaceable components, may be scheduled, sequenced, or ordered for service at one or more selected service stations, based at least in part on respective service frequencies associated with the replaceable components. As a result, the replaceable components may be efficiently and reliably serviced at the one or more selected service stations according to their respective service frequencies over time, thereby ensuring safe and reliable operations of the replaceable components and the aerial vehicles onto which the components are incorporated.

FIG. 9 is a block diagram illustrating various components of an example aerial vehicle control system 900, in accordance with disclosed implementations.

In various examples, the block diagram may be illustrative of one or more aspects of the aerial vehicle control system 900 that may be used to implement the various systems and processes discussed above. In the illustrated implementation, the aerial vehicle control system 900 includes one or more processors 902, coupled to a non-transitory computer readable storage medium 920 via an input/output (I/O) interface 910. The aerial vehicle control system 900 may also include a propulsion controller 904, a power supply or battery 906, and/or a navigation system 907. The aerial vehicle control system 900 may further include a payload engagement controller 912, a network interface 916, and one or more input/output devices 917.

In various implementations, the aerial vehicle control system 900 may be a uniprocessor system including one processor 902, or a multiprocessor system including several processors 902 (e.g., two, four, eight, or another suitable number). The processor(s) 902 may be any suitable processor capable of executing instructions. For example, in various implementations, the processor(s) 902 may be general-purpose or embedded processors implementing any of a variety of instruction set architectures (ISAs), such as the x86, PowerPC, SPARC, or MIPS ISAs, or any other suitable ISA. In multiprocessor systems, each processor(s) 902 may commonly, but not necessarily, implement the same ISA.

The non-transitory computer readable storage medium 920 may be configured to store executable instructions, data, and aerial vehicle and line replaceable unit (or replaceable component) data, including aerial vehicle type or configuration data, operational profiles and data, environmental profiles and data, reliability and durability testing data, LRU data, LRU degradation or service profile data, LRU service frequency data, LRU location data, LRU connection type data, LRU service type data, LRU service agent data, and/or other data items accessible by the processor(s) 902. In various implementations, the non-transitory computer readable storage medium 920 may be implemented using any suitable memory technology, such as static random access memory (SRAM), synchronous dynamic RAM (SDRAM), nonvolatile/Flash-type memory, or any other type of memory. In the illustrated implementation, program instructions and data implementing desired functions, such as those described above, are shown stored within the non-transitory computer readable storage medium 920 as program instructions 922, data storage 924 and aerial vehicle and LRU data 926, respectively. In other implementations, program instructions, data and/or aerial vehicle and LRU data may be received, sent or stored upon different types of computer-accessible media, such as non-transitory media, or on similar media separate from the non-transitory computer readable storage medium 920 or the aerial vehicle control system 900.

Generally, a non-transitory, computer readable storage medium may include storage media or memory media such as magnetic or optical media, e.g., disk or CD/DVD-ROM, coupled to the aerial vehicle control system 900 via the I/O interface 910. Program instructions and data stored via a non-transitory computer readable medium may be transmitted by transmission media or signals, such as electrical, electromagnetic, or digital signals, which may be conveyed via a communication medium such as a network and/or a wireless link, such as may be implemented via the network interface 916.

In one implementation, the I/O interface 910 may be configured to coordinate I/O traffic between the processor(s) 902, the non-transitory computer readable storage medium 920, and any peripheral devices, the network interface 916 or other peripheral interfaces, such as input/output devices 917. In some implementations, the I/O interface 910 may perform any necessary protocol, timing or other data transformations to convert data signals from one component (e.g., non-transitory computer readable storage medium 920) into a format suitable for use by another component (e.g., processor(s) 902). In some implementations, the I/O interface 910 may include support for devices attached through various types of peripheral buses, such as a variant of the Peripheral Component Interconnect (PCI) bus standard or the Universal Serial Bus (USB) standard, for example. In some implementations, the function of the I/O interface 910 may be split into two or more separate components, such as a north bridge and a south bridge, for example. Also, in some implementations, some or all of the functionality of the I/O interface 910, such as an interface to the non-transitory computer readable storage medium 920, may be incorporated directly into the processor(s) 902.

The propulsion controller 904 communicates with the navigation system 907 and adjusts the operational characteristics of each propulsion mechanism to guide the aerial vehicle along a determined path and/or to perform other navigational maneuvers. The navigation system 907 may include a GPS or other similar system than can be used to navigate the aerial vehicle to and/or from a location.

The aerial vehicle control system 900 may also include a payload engagement controller 912 that communicates with the processor(s) 902, the non-transitory computer readable storage medium 920, sensors, and/or other components or systems to engage, retain, transport, and/or disengage a payload carried by the aerial vehicle.

The network interface 916 may be configured to allow data to be exchanged between the aerial vehicle control system 900, and other devices attached to a network, such as other computer systems, other aerial vehicle control systems, various sensors, and/or control systems of other vehicles, systems, machines, equipment, apparatuses, systems, or devices. For example, the network interface 916 may enable wireless communication between numerous aerial vehicles. In various implementations, the network interface 916 may support communication via wireless general data networks, such as a Wi-Fi network. For example, the network interface 916 may support communication via telecommunications networks such as cellular communication networks, satellite networks, and the like.

Input/output devices 917 may, in some implementations, include one or more visual input/output devices, audio input/output devices, imaging sensors, thermal sensors, infrared sensors, time of flight sensors, magnetometers, altimeters, pitot tubes, accelerometers, gyroscopes, pressure sensors, weather sensors, temperature sensors, particulate sensors, light sensors, radiation sensors, force sensors, load sensors, impact sensors, various other types of sensors, etc. Multiple input/output devices 917 may be present and controlled by the aerial vehicle control system 900. One or more of these sensors may be utilized to assist in performing the various functions, operations, and processes of aerial vehicles and replaceable components described herein.

As shown in FIG. 9, the memory may include program instructions 922 which may be configured to implement the example processes and/or sub-processes described above. The data storage 924 and/or the aerial vehicle and LRU data 926 may include various data stores for maintaining data items that may be provided for performing the various functions, operations, and processes described herein. For example, the data storage 924 and/or the aerial vehicle and LRU data 926 may include aerial vehicle type or configuration data, operational profiles and data, environmental profiles and data, reliability and durability testing data, LRU data, LRU degradation or service profile data, LRU service frequency data, LRU location data, LRU connection type data, LRU service type data, LRU service agent data, and/or other data items.

Those skilled in the art will appreciate that the aerial vehicle control system 900 is merely illustrative and is not intended to limit the scope of the present disclosure. In particular, the computing system and devices may include any combination of hardware or software that can perform the indicated functions, including other control systems or controllers, computers, network devices, internet appliances, PDAs, wireless phones, pagers, etc. The aerial vehicle control system 900 may also be connected to other devices that are not illustrated, or instead may operate as a stand-alone system. In addition, the functionality provided by the illustrated components may, in some implementations, be combined in fewer components or distributed in additional components. Similarly, in some implementations, the functionality of some of the illustrated components may not be provided and/or other additional functionality may be available.

While the above examples have been described with respect to aerial vehicles, the disclosed implementations may also be used for other forms of vehicles, including, but not limited to, ground based vehicles, water based vehicles, and space based vehicles.

FIG. 10 is a block diagram illustrating various components of an example control system 1000, in accordance with implementations of the present disclosure.

Various operations of a control system or controller, such as those described herein, may be executed on one or more computer systems, and/or interacting with various other computers, systems, or devices in an aerial vehicle management, service, and/or maintenance facility, according to various implementations. For example, the control system or controller discussed above may function and operate on one or more computer systems. One such control system is illustrated by the block diagram in FIG. 10. In the illustrated implementation, a control system 1000 includes one or more processors 1010A, 1010B through 1010N, coupled to a non-transitory computer-readable storage medium 1020 via an input/output (I/O) interface 1030. The control system 1000 further includes a network interface 1040 coupled to the I/O interface 1030, and one or more input/output devices 1050. In some implementations, it is contemplated that a described implementation may be implemented using a single instance of the control system 1000 while, in other implementations, multiple such systems or multiple nodes making up the control system 1000 may be configured to host different portions or instances of the described implementations. For example, in one implementation, some data sources or services (e.g., related to portions of aerial vehicle and LRU designation, design, and/or service systems, operations, or processes, etc.) may be implemented via one or more nodes of the control system 1000 that are distinct from those nodes implementing other data sources or services (e.g., related to other portions of aerial vehicle and LRU designation, design, and/or service systems, operations, or processes, etc.).

In various implementations, the control system 1000 may be a uniprocessor system including one processor 1010A, or a multiprocessor system including several processors 1010A-1010N (e.g., two, four, eight, or another suitable number). The processors 1010A-1010N may be any suitable processor capable of executing instructions. For example, in various implementations, the processors 1010A-1010N may be general-purpose or embedded processors implementing any of a variety of instruction set architectures (ISAs), such as the x86, PowerPC, SPARC, or MIPS ISAs, or any other suitable ISA. In multiprocessor systems, each of the processors 1010A-1010N may commonly, but not necessarily, implement the same ISA.

The non-transitory computer-readable storage medium 1020 may be configured to store executable instructions and/or data accessible by the one or more processors 1010A-1010N. In various implementations, the non-transitory computer-readable storage medium 1020 may be implemented using any suitable memory technology, such as static random access memory (SRAM), synchronous dynamic RAM (SDRAM), nonvolatile/Flash-type memory, or any other type of memory. In the illustrated implementation, program instructions and data implementing desired functions and/or processes, such as those described above, are shown stored within the non-transitory computer-readable storage medium 1020 as program instructions 1025 and data storage 1035, respectively. In other implementations, program instructions and/or data may be received, sent or stored upon different types of computer-accessible media, such as non-transitory media, or on similar media separate from the non-transitory computer-readable storage medium 1020 or the control system 1000. Generally speaking, a non-transitory, computer-readable storage medium may include storage media or memory media such as magnetic or optical media, e.g., disk or CD/DVD-ROM, coupled to the control system 1000 via the I/O interface 1030. Program instructions and data stored via a non-transitory computer-readable medium may be transmitted by transmission media or signals such as electrical, electromagnetic, or digital signals, which may be conveyed via a communication medium such as a network and/or a wireless link, such as may be implemented via the network interface 1040.

In one implementation, the I/O interface 1030 may be configured to coordinate I/O traffic between the processors 1010A-1010N, the non-transitory computer-readable storage medium 1020, and any peripheral devices, including the network interface 1040 or other peripheral interfaces, such as input/output devices 1050. In some implementations, the I/O interface 1030 may perform any necessary protocol, timing or other data transformations to convert data signals from one component (e.g., non-transitory computer-readable storage medium 1020) into a format suitable for use by another component (e.g., processors 1010A-1010N). In some implementations, the I/O interface 1030 may include support for devices attached through various types of peripheral buses, such as a variant of the Peripheral Component Interconnect (PCI) bus standard or the Universal Serial Bus (USB) standard, for example. In some implementations, the function of the I/O interface 1030 may be split into two or more separate components, such as a north bridge and a south bridge, for example. Also, in some implementations, some or all of the functionality of the I/O interface 1030, such as an interface to the non-transitory computer-readable storage medium 1020, may be incorporated directly into the processors 1010A-1010N.

The network interface 1040 may be configured to allow data to be exchanged between the control system 1000 and other devices attached to a network, such as other control systems, other aerial vehicle and LRU management, service, and/or maintenance facility control systems, aerial vehicle control systems, other computer systems, service stations, transport systems for service stations, robotic, automated, or semi-automated service agents, various types of sensors, other service or maintenance facility machinery, systems, or equipment, and/or between nodes of the control system 1000. In various implementations, the network interface 1040 may support communication via wired or wireless general data networks, such as any suitable type of Ethernet network.

Input/output devices 1050 may, in some implementations, include one or more visual input/output devices, audio input/output devices, keyboards, keypads, touchpads, scanning devices, imaging devices, sensors, photo eyes, proximity sensors, RFID readers, voice or optical recognition devices, or any other devices suitable for entering or retrieving data by one or more control systems 1000. Multiple input/output devices 1050 may be present in the control system 1000 or may be distributed on various nodes of the control system 1000. In some implementations, similar input/output devices may be separate from the control system 1000 and may interact with one or more nodes of the control system 1000 through a wired or wireless connection, such as over the network interface 1040.

As shown in FIG. 10, the memory 1020 may include program instructions 1025 that may be configured to implement one or more of the described implementations and/or provide data storage 1035, which may comprise various tables, data stores and/or other data structures accessible by the program instructions 1025. The program instructions 1025 may include various executable instructions, programs, or applications to facilitate aerial vehicle and LRU designation, design, and/or service operations and processes described herein, such as aerial vehicle controllers, drivers, or applications, LRU controllers, drivers, or applications, service station controllers, drivers, or applications, service agent controllers, drivers, or applications, data processing applications or modules to process aerial vehicle data, LRU data, service station data, and/or service agent data, various other aerial vehicle and LRU designation, design, and/or service controllers, drivers, or applications, etc. The data storage 1035 may include various data stores for maintaining data related to systems, operations, or processes described herein, such as aerial vehicle type or configuration data, operational profiles and data, environmental profiles and data, reliability and durability testing data, LRU data, LRU degradation or service profile data, LRU service frequency data, LRU location data, LRU connection type data, LRU service type data, LRU service agent data, service station data, service agent data, and/or other data items, etc.

Those skilled in the art will appreciate that the control system 1000 is merely illustrative and is not intended to limit the scope of implementations. In particular, the control system and devices may include any combination of hardware or software that can perform the indicated functions, including other control systems or controllers, computers, network devices, internet appliances, robotic devices, etc. The control system 1000 may also be connected to other devices that are not illustrated, or instead may operate as a stand-alone system. In addition, the functionality provided by the illustrated components may, in some implementations, be combined in fewer components or distributed in additional components. Similarly, in some implementations, the functionality of some of the illustrated components may not be provided and/or other additional functionality may be available.

It should be understood that, unless otherwise explicitly or implicitly indicated herein, any of the features, characteristics, alternatives or modifications described regarding a particular implementation herein may also be applied, used, or incorporated with any other implementation described herein, and that the drawings and detailed description of the present disclosure are intended to cover all modifications, equivalents and alternatives to the various implementations as defined by the appended claims. Moreover, with respect to the one or more methods or processes of the present disclosure described herein, including but not limited to the flow charts shown in FIGS. 6-8, orders in which such methods or processes are presented are not intended to be construed as any limitation on the claimed inventions, and any number of the method or process steps or boxes described herein can be omitted, reordered, or combined in any order and/or in parallel to implement the methods or processes described herein. Also, the drawings herein are not drawn to scale.

Conditional language, such as, among others, "can," "could," "might," or "may," unless specifically stated otherwise, or otherwise understood within the context as used, is generally intended to convey in a permissive manner that certain implementations could include, or have the potential to include, but do not mandate or require, certain features, elements and/or steps. In a similar manner, terms such as "include," "including" and "includes" are generally intended to mean "including, but not limited to." Thus, such conditional language is not generally intended to imply that features, elements and/or steps are in any way required for one or more implementations or that one or more implementations necessarily include logic for deciding, with or without user input or prompting, whether these features, elements and/or steps are included or are to be performed in any particular implementation.

The elements of a method, process, or algorithm described in connection with the implementations disclosed herein can be embodied directly in hardware, in a software module stored in one or more memory devices and executed by one or more processors, or in a combination of the two. A software module can reside in RAM, flash memory, ROM, EPROM, EEPROM, registers, a hard disk, a removable disk, a CD ROM, a DVD-ROM or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or nonvolatile. The processor and the storage medium can reside in an ASIC. The ASIC can reside in a user terminal. In the alternative, the processor and the storage medium can reside as discrete components in a user terminal.

Disjunctive language such as the phrase "at least one of X, Y, or Z," or "at least one of X, Y and Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain implementations require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:

1. An aerial vehicle, comprising:
  a body;
  a propulsion mechanism;
  a first replaceable component positioned at an outer portion of the body based at least in part on a first service frequency associated with the first replaceable component; and
  a second replaceable component positioned at an inner portion of the body based at least in part on a second service frequency associated with the second replaceable component;
  wherein the first service frequency is a higher frequency than the second service frequency; and
  wherein the first replaceable component and the second replaceable component are stacked relative to each other.

2. The aerial vehicle of claim 1, wherein the first service frequency is determined based at least in part on at least one of operational data, environmental data, or component testing data associated with the first replaceable component; and
  wherein the second service frequency is determined based at least in part on at least one of operational data, environmental data, or component testing data associated with the second replaceable component.

3. The aerial vehicle of claim 1, wherein the first replaceable component includes a first connection type; and
  wherein the second replaceable component includes a second connection type.

4. The aerial vehicle of claim 3, wherein each of the first connection type and the second connection type comprises at least one of a latch, a tab, a clip, a pin, a spring-loaded connection, a bayonet connection, a threaded connection, or a magnetic connection.

5. The aerial vehicle of claim 3, wherein the first connection type is determined based at least in part on at least one of a first service type or a first service agent; and wherein the second connection type is determined based at least in part on at least one of a second service type or a second service agent.

6. The aerial vehicle of claim 5, wherein each of the first service type and the second service type comprises at least one of removal, replacement, cleaning, testing, updating, or calibrating; and wherein each of the first service agent and the second service agent comprises at least one of a robotic agent, an automated agent, a semi-automated agent, or a human agent.

7. The aerial vehicle of claim 1, wherein the first replaceable component comprises a first replaceable module including at least two components each having the first service frequency;

wherein the at least two components comprise a same type or different types of components.

8. The aerial vehicle of claim 1, further comprising:

a third replaceable component positioned at a further inner portion of the body based at least in part on a third service frequency associated with the third replaceable component;

wherein the third service frequency is a lower frequency than each of the second service frequency and the first service frequency.

9. The aerial vehicle of claim 1, wherein the first replaceable component is the propulsion mechanism.

10. The aerial vehicle of claim 1, wherein each of the first replaceable component and the second replaceable component comprises at least one of a propeller, a motor, an electronic speed controller, a control servo, a control rod, a control surface, an aileron, a landing gear, a power supply, a sensor, an imaging device, a magnetometer, an altimeter, a pitot tube, a wire, a connector, an antenna, or a compute board.

11. An aerial vehicle, comprising:

a body;

a propulsion mechanism; and a plurality of replaceable components positioned at respective portions of the body based at least in part on respective service frequencies associated with individual components of the plurality of replaceable components;

wherein a first component of the plurality of replaceable components having a higher service frequency is positioned toward an outer portion of the body relative to a second component of the plurality of replaceable components having a lower service frequency; and wherein the first component and the second component are stacked relative to each other.

12. The aerial vehicle of claim 11, wherein the respective service frequencies are determined based at least in part on at least one of operational data, environmental data, or component testing data associated with individual components of the plurality of replaceable components.

13. The aerial vehicle of claim 11, wherein the first component is stacked on top of the second component.

14. The aerial vehicle of claim 11, wherein a third component of the plurality of replaceable components has a same service frequency as the first component; and wherein the first component and the third component comprise a first replaceable module positioned at a first respective portion of the body.

15. The aerial vehicle of claim 14, wherein a fourth component of the plurality of replaceable components has a same service frequency as the second component; and wherein the second component and the fourth component comprise a second replaceable module positioned at a second respective portion of the body.

16. The aerial vehicle of claim 15, wherein the first replaceable module is positioned toward an outer portion of the body relative to the second replaceable module.

17. The aerial vehicle of claim 16, wherein the first replaceable module is stacked on top of the second replaceable module.

18. An aerial vehicle, comprising:

a body;

a propulsion mechanism; and a plurality of replaceable modules positioned at respective portions of the body based at least in part on respective service frequencies associated with individual modules of the plurality of replaceable modules;

wherein a first module of the plurality of replaceable modules having a higher service frequency is positioned toward an outer portion of the body relative to a second module of the plurality of replaceable modules having a lower service frequency; and wherein the first module and the second module are stacked relative to each other.

19. The aerial vehicle of claim 18, wherein individual modules of the plurality of replaceable modules include one or more components having a same service frequency.

* * * * *